United States Patent
Okada et al.

(10) Patent No.: US 9,728,426 B2
(45) Date of Patent: Aug. 8, 2017

(54) METHOD FOR PRODUCING RESIN-ENCAPSULATED ELECTRONIC COMPONENT, BUMP-FORMED PLATE-LIKE MEMBER, RESIN-ENCAPSULATED ELECTRONIC COMPONENT, AND METHOD FOR PRODUCING BUMP-FORMED PLATE-LIKE MEMBER

(71) Applicant: TOWA CORPORATION, Kyoto-shi, Kyoto (JP)

(72) Inventors: Hirokazu Okada, Kyoto (JP); Hiroshi Uragami, Kyoto (JP); Tsuyoshi Amakawa, Kyoto (JP); Muneo Miura, Kyoto (JP)

(73) Assignee: TOWA CORPORATION, Kyoto-shi, Kyoto (JP)

( * ) Notice: Subject to any disclaimer, the term of this patent is extended or adjusted under 35 U.S.C. 154(b) by 0 days.

(21) Appl. No.: 14/581,624

(22) Filed: Dec. 23, 2014

(65) Prior Publication Data

US 2015/0311095 A1 Oct. 29, 2015

(30) Foreign Application Priority Data

Apr. 24, 2014 (JP) .................................. 2014-090753

(51) Int. Cl.
*H01L 23/31* (2006.01)
*H01L 21/56* (2006.01)
(Continued)

(52) U.S. Cl.
CPC .............. *H01L 21/565* (2013.01); *C25D 1/00* (2013.01); *H01L 21/561* (2013.01);
(Continued)

(58) Field of Classification Search
CPC ..... H01L 24/81; H01L 21/565; H01L 21/563; H01L 2924/16153; H01L 2924/16151;
(Continued)

(56) References Cited

U.S. PATENT DOCUMENTS 4,639,759 A 1/1987 Neidig
6,580,167 B1 6/2003 Glenn
(Continued)

FOREIGN PATENT DOCUMENTS

EP 2560201 A2 2/2013
JP 2004-174801 A 6/2004
(Continued)

OTHER PUBLICATIONS

Office Action for the corresponding Japanese Patent Application No. 2014-090753 mailed Sep. 30, 2015 and its partial translation.
(Continued)

*Primary Examiner* — Sitaramarao S Yechuri
(74) *Attorney, Agent, or Firm* — Muncy, Geissler, Olds & Lowe, P.C.

(57) ABSTRACT

The present invention provides a method for producing a resin-encapsulated electronic component, capable of simply and efficiently producing a resin-encapsulated electronic component having both of a via electrode(s) (bump(s)) and a plate-like member. The method includes a resin-encapsulation step of encapsulating at least one electronic component in a resin. A produced resin-encapsulated electronic component includes: a substrate; the at least one electronic component; the resin; a plate-like member; and at least one bump. A wiring pattern is formed on the substrate. In the resin-encapsulation step, between a bump-formed surface in a bump-formed plate-like member obtained by forming the at least one bump in the plate-like member and a wiring pattern-formed surface in the substrate, the at least one
(Continued)

electronic component is encapsulated in the resin, and the at least one bump is caused to be in contact with the wiring pattern.

3 Claims, 15 Drawing Sheets

(51) Int. Cl.
| | | |
|---|---|---|
| *C25D 1/00* | (2006.01) | |
| *H01L 23/433* | (2006.01) | |
| *H01L 23/552* | (2006.01) | |

(52) U.S. Cl.
CPC ........ *H01L 23/4334* (2013.01); *H01L 23/552* (2013.01); *H01L 23/3107* (2013.01); *H01L 2924/16153* (2013.01)

(58) Field of Classification Search
CPC ..... H01L 2924/16152; H01L 2924/161; H01L 2924/6111; H05K 2201/09036
USPC ............ 257/723, 668, 673; 438/127; 264/77
See application file for complete search history.

(56) References Cited

U.S. PATENT DOCUMENTS

| | | | |
|---|---|---|---|
| 6,617,615 B1* | 9/2003 | Ueda ..................... | H01L 25/167 257/100 |
| 6,775,140 B2 | 8/2004 | Shim | |
| 7,259,445 B2 | 8/2007 | Lau | |
| 7,989,707 B2 | 8/2011 | Yamano | |
| 8,012,799 B1 | 9/2011 | Ibrahim | |
| 8,178,956 B2 | 5/2012 | Do | |
| 8,319,333 B2 | 11/2012 | Oka et al. | |
| 8,395,254 B2 | 3/2013 | Espiritu | |
| 2001/0024724 A1 | 9/2001 | Mccullough | |
| 2002/0005569 A1* | 1/2002 | Kobayashi ........... | G01R 1/0466 257/666 |
| 2002/0118465 A1 | 8/2002 | Hosoe | |
| 2003/0049425 A1* | 3/2003 | Ono ...................... | H01L 21/563 428/217 |
| 2003/0071348 A1* | 4/2003 | Eguchi ................... | H01L 21/56 257/723 |
| 2004/0141291 A1* | 7/2004 | Chen ....................... | F28F 3/02 361/704 |
| 2004/0248421 A1* | 12/2004 | Yorita ................. | B81C 99/0085 438/719 |
| 2006/0060891 A1* | 3/2006 | Pavier ................. | H01L 23/3107 257/232 |
| 2006/0186576 A1 | 8/2006 | Takase et al. | |
| 2008/0265355 A1* | 10/2008 | Yoshizawa ........... | H01L 21/566 257/433 |
| 2009/0068302 A1 | 3/2009 | Nakamura et al. | |
| 2009/0121351 A1 | 5/2009 | Endo | |
| 2009/0140402 A1* | 6/2009 | Ohtani ................... | H01L 21/56 257/675 |
| 2009/0146301 A1* | 6/2009 | Shimizu ................. | B29C 43/18 257/738 |
| 2009/0151995 A1 | 6/2009 | Koizumi et al. | |
| 2010/0127383 A1 | 5/2010 | Oka et al. | |
| 2011/0198743 A1* | 8/2011 | Nikitin .................. | H01L 23/492 257/690 |
| 2012/0223622 A1* | 9/2012 | Otsuki ..................... | H03H 9/02 310/344 |
| 2012/0261699 A1* | 10/2012 | Ooyabu ................ | H01L 33/505 257/98 |
| 2013/0048252 A1* | 2/2013 | Yang ....................... | F28F 21/04 165/104.26 |
| 2013/0119523 A1* | 5/2013 | Cheng ................... | H01L 23/552 257/659 |
| 2013/0270683 A1 | 10/2013 | Tsai | |
| 2013/0337614 A1* | 12/2013 | Fuergut ............... | H01L 23/3121 438/124 |
| 2014/0083671 A1 | 3/2014 | Ideguchi et al. | |
| 2014/0262475 A1 | 9/2014 | Liu et al. | |
| 2015/0008583 A1* | 1/2015 | Gerber .................... | H01L 21/78 257/761 |
| 2015/0017372 A1 | 1/2015 | Uragami et al. | |
| 2015/0170986 A1* | 6/2015 | Szymanowski ..... | H01L 23/3121 330/295 |

FOREIGN PATENT DOCUMENTS

| | | |
|---|---|---|
| JP | 2005-225133 A | 8/2005 |
| JP | 2006-287101 A | 10/2006 |
| JP | 2007-125783 A | 5/2007 |
| JP | 2007-287937 A | 11/2007 |
| JP | 2010-036542 A | 2/2010 |
| JP | 2010-069656 A | 4/2010 |
| JP | 2010-129550 A | 6/2010 |
| JP | 2012-015216 A | 1/2012 |
| JP | 2013-058516 A | 3/2013 |
| JP | 2013-187340 A | 9/2013 |
| JP | 2013-239512 A | 11/2013 |
| JP | 2014-123618 A | 7/2014 |
| TW | 463334 B | 11/2001 |
| TW | 200929478 A | 7/2009 |
| TW | 201311073 A1 | 3/2013 |
| TW | 201338063 A | 9/2013 |

OTHER PUBLICATIONS

Office Action issued in the related U.S. Appl. No. 14/755,819 dated Jul. 8, 2016.
Office Action in the related Singapore Patent Application No. 10201509770R dated May 10, 2016.
Master Die (n.d.) The Great Soviet Encyclopedia, 3$^{rd}$ Edition, (1970-1979) http://encyclopedia2.thefreedictionary.com/Master+Die.
Written Opinion issued from the Intellectual Property Offfice of Singapore dated Nov. 29, 2016.
Office Action issued in the corresponding Taiwanese Patent Application (No. 103140295) dated Jul. 21, 2016.

\* cited by examiner

METHOD FOR PRODUCING RESIN-ENCAPSULATED ELECTRONIC COMPONENT, BUMP-FORMED PLATE-LIKE MEMBER, RESIN-ENCAPSULATED ELECTRONIC COMPONENT, AND METHOD FOR PRODUCING BUMP-FORMED PLATE-LIKE MEMBER

CROSS-REFERENCE TO RELATED APPLICATION

This application is based upon and claims the benefit of priority from Japanese patent application No. 2014-090753, filed on Apr. 24, 2014, the disclosure of which is incorporated herein in its entirety by reference.

BACKGROUND OF THE INVENTION

The present invention relates to a method for producing a resin-encapsulated electronic component, a bump-formed plate-like member, a resin-encapsulated electronic component, and a method for producing a bump-formed plate-like member.

An electronic component such as an IC or a semiconductor chip is molded and used as a resin-encapsulated electronic component in many cases.

The resin-encapsulated electronic component is formed by embedding a via electrode in a resin in some cases. This via electrode can be formed by, for example, forming a hole or a groove for via formation (hereinafter referred to as a "hole for via formation") in the resin of the resin-encapsulated electronic component (package) from the upper surface of the package and embedding a material for forming a via electrode (e.g., plating, a shielding material or the like) in the hole for via formation. The hole for via formation can be formed by irradiating the resin with a laser beam from the upper surface of the package, for example. Moreover, as another method for forming a via electrode, a method in which a projection in a metal structure having the projection is subjected to resin-encapsulation together with a semiconductor chip, and thereafter, the metal structure except for the projection is removed has been proposed (JP 2012-015216 A). In this case, only the projection of the metal structure remains in the resin-encapsulated electronic component in the state of being subjected to resin-encapsulation, and this projection becomes a via electrode.

On the other hand, the resin-encapsulated electronic component is molded together with a plate-like member such as a heat radiation plate (heat sink) for cooling by discharging heat generated from the electronic component or a shield plate (shield) for shielding an electromagnetic wave generated from the electronic component (e.g., JP 2013-187340 A and JP 2007-287937 A).

BRIEF SUMMARY OF THE INVENTION

For example, the method in which a hole for via formation is formed in a resin involves the following problems (1) to (5):
(1) there is a possibility that the depth and the like of a hole for via formation are not correctly appropriately formed on a wiring pattern of a substrate due to variations in thickness of the resin-encapsulated electronic component (package) and the like;
(2) Fillers contained in a resin material are prone to remain on a wiring pattern of a substrate;
(3) According to the conditions under which a hole for via formation is bored in the resin, there is a possibility that damage is caused to a wiring pattern on an electronic component-mounted substrate;
(4) In association with the problem (3), when the density of the fillers in the resin material differs, it is required to change conditions under which a laser processing of boring a hole for via formation in the resin is performed, i.e., it is complicated to control conditions under which a hole for via formation is formed; and
(5) By the influences of the problems (1) to (4), it is difficult to improve the yield in production of a resin-encapsulated electronic component.

On the other hand, in the method disclosed in JP 2012-015216 A, it is required to perform a step of removing the metal structure except for the projection after resin-encapsulation of the projection in the metal structure. Therefore, the step of producing a resin-encapsulated electronic component is complicated, and the material is wasted.

Moreover, in any of the above-described methods, in order to form a plate-like member, plating or the like is required to be performed after formation of a via electrode. Thus, the step is complicated.

Although JP 2013-187340 A and JP 2007-287937 A disclose a resin-encapsulated electronic component having a plate-like member and a method for producing the same, none of them discloses a method by which the problems of the above-described methods are solved in formation of a via electrode.

As described above, there has been no technology capable of simply and efficiently producing a resin-encapsulated electronic component having both of a via electrode and a plate-like member.

Hence the present invention is intended to provide a method for producing a resin-encapsulated electronic component, a bump-formed plate-like member, a resin-encapsulated electronic component, and a method for producing a bump-formed plate-like member, capable of simply and efficiently producing a resin-encapsulated electronic component having both of a via electrode(s) and a plate-like member.

In order to achieve the aforementioned object, the method for producing a resin-encapsulated electronic component according to the present invention (hereinafter also referred to as "the production method of the present invention") is a method for producing a resin-encapsulated electronic component including a substrate; at least one electronic component; a resin; a plate-like member having at least one surface; at least one bump; and a wiring pattern, the method including: a step of disposing the one electronic component on the surface; and a resin-encapsulation step of encapsulating the at least one electronic component in the resin, wherein the resin-encapsulation step comprises encapsulating the one electronic component in the resin between a bump-formed surface of the plate-like member on which the one bump is formed and a wiring pattern-formed surface of the substrate on which the wiring pattern is formed, and causing the at least one bump to be in contact with the wiring pattern.

The bump-formed plate-like member of the present invention is a bump-formed plate like member for use in the production method of the present invention, wherein the at least one bump is formed on a plate-like member.

The resin-encapsulated electronic component of the present invention is a resin-encapsulated electronic component, including: a substrate; at least one electronic component; a resin; and the bump-formed plate-like member of the present } invention, wherein the at least one electronic component is arranged on the substrate and encapsulated in the resin, a wiring pattern is formed on the substrate on a side on which the at least one electronic component is arranged, and the at least one bump penetrates the resin and is in contact with the wiring pattern.

According to the present invention, a method for producing a resin-encapsulated electronic component, a bump-formed plate-like member, a resin-encapsulated electronic component, and a method for producing a bump-formed plate-like member, capable of simply and efficiently producing a resin-encapsulated electronic component having both of a via electrode(s) and a plate-like member can be provided.

DETAILED DESCRIPTION OF THE INVENTION

Figure 1A:
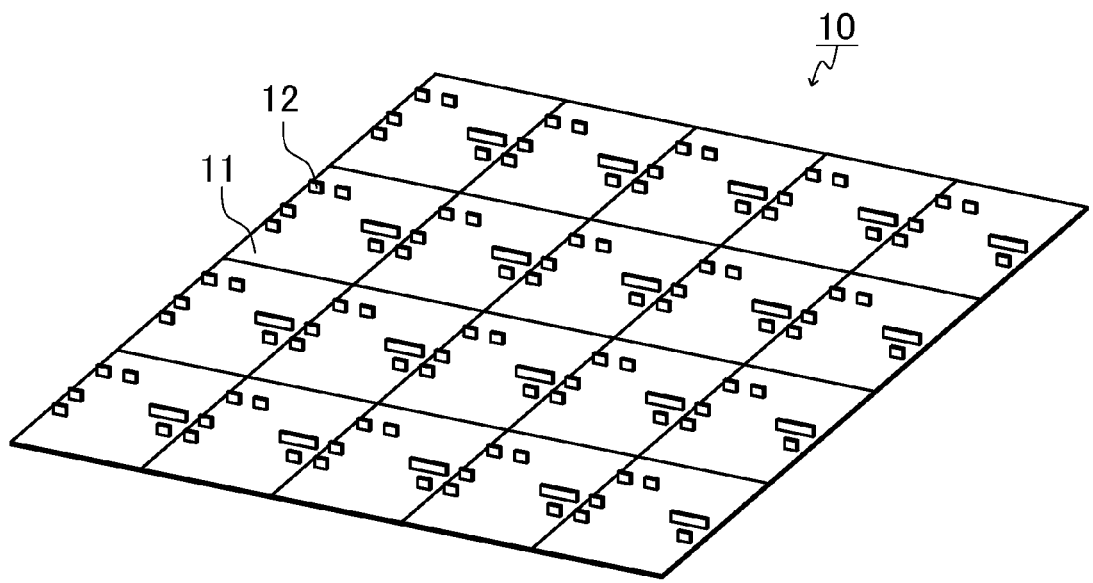
FIGS. 1A and 1B shows perspective views showing examples of the structure of a bump-formed plate-like member of the present invention.

The present invention is described in more detail below with reference to examples. The present invention, however, is not limited by the following description.

In the production method of the present invention, the number of the bumps is not particularly limited and may be any number of one or more. The shape of the bump is not particularly limited. When there are plural bumps, the shapes of the bumps may be identical to or different from each other. For example, at least one bump may be a bump having a through hole. More specifically, the through hole in the through hole-formed bump may be a through hole penetrating the plate-like member in the direction parallel with a plate surface of the plate-like member. The through hole-formed bump may have a projection projecting at the end opposite to an end formed in the plate-like member in the direction perpendicular to the plate surface of the plate-like member. More specifically, examples of the shape of such through hole-formed bump may include the shapes shown (A) to (C) in FIG. 2 described below.

In the production method of the present invention, at least one bump may be a columnar bump having a columnar shape. Examples of the shape of the columnar bump include a cylindrical shape, a prismatic shape, a cone shape, a pyramid shape, a truncated cone shape, and a truncated pyramid shape.

In the production method of the present invention, at least one bump may be a plate-like bump. In this case, there are plural electronic components, and in the resin-encapsulation step, the substrate may be partitioned into plural regions with the plate-like bump(s), and the resin-encapsulation of the at least one electronic component may be performed in the regions. Moreover, it is preferred that, the plate-like bump(s) has a through hole and a projection, the through hole penetrates the plate-like bump in the direction parallel with the plate surface of the plate-like member, and the projection projects at an end opposite to an end formed in the plate-like member in the direction perpendicular to the plate surface of the plate-like member.

In the production method of the present invention, the plate-like member is not particularly limited and is preferably a heat radiation plate (heat sink) or a shield plate (shield). The shield plate may shield an electromagnetic wave emitted from the electronic component(s), for example. It is preferred that the heat radiation plate has a heat radiation fin on the surface opposite to the bump-formed surface. The shape of the plate-like member is not particularly limited except that the bump(s) are formed therein. For example, when the plate-like member is a heat radiation plate, the heat radiation plate has a shape (e.g., fin shape) in which one or more projections for improving heat radiation efficiency are bound thereto or the like. The material of the plate-like member also is not particularly limited, and when the plate-like member is a heat radiation plate or a shield plate, a metal material, a ceramics material, a resin, or a metal vapor deposition film can be used, for example. The metal vapor deposition film is not particularly limited and may be, for example, a metal vapor deposition film obtained by vapor deposition of aluminium, silver, or the like on a film. Moreover, although the material of the bump is not particularly limited, a metal material, a ceramics material, a resin, or the like can be used, for example. The metal material is not particularly limited, and examples thereof include: an iron-based material such as stainless or Permalloy (alloy of iron and nickel); a copper-based material such as brass, a copper-molybdenum alloy, or beryllium copper; and an aluminium-based material such as duralumin. Although the ceramics material is not particularly limited, and examples thereof include: an alumina-based material such as aluminum nitride; a silicon-based material such as silicon nitride; and zirconia-based material. Although the resin is not particularly limited, examples thereof include: a rubber-based material such as an elastomer resin; a material obtained by mixing a conductive material in a silicon-based base material; and a resin material obtained by extrusion molding or injection molding of any of these materials. A conductive layer may be formed on the surface of the plate-like member or the like in the bump-formed plate-like member by a surface treatment such as plating or coating. The plate-like member is also a functional member (working member) that has any function. For example, in the case where the plate-like member is a heat radiation plate (heat sink), the plate-like member is a functional member (working member) having a heat radiation function (heat radiation action), and in the case where the plate-like member is a shield plate (shield), the plate-like member is a functional member (working member) having a shielding function (shielding action).

In the resin-encapsulation step, a method for use in the resin-encapsulation (molding method) is not particularly limited, and for example, any of transfer molding, compression molding, and the like may be used.

In the case where compression molding is used in the resin-encapsulation step, the production method of the present invention may further include a resin placement step of placing the resin on the bump-formed surface of the bump-formed plate-like member. Moreover, in this case, the production method of the present invention may further include a transfer step of transferring the bump-formed plate-like member to a die cavity in a molding die. The resin-encapsulation step may be performed by compression molding of the resin in the die cavity together with the bump-formed plate-like member and the electronic component(s) in the state where the electronic component(s) is immersed in the resin placed on the plate-like member.

The order of performing the resin placement step and the transfer step is not particularly limited. Any of them may be performed prior to the other, or both of them may be performed at the same time. For example, in the transfer step, the resin may be transferred to a die cavity in a molding die together with the pump-formed plate-like member in the state where the resin is placed on the bump-formed plate-like member. Furthermore, in the transfer step, the bump-formed plate-like member may be transferred to a die cavity in a molding die in the state where the resin is not placed on the bump-formed plate-like member. In this case, the production method of the present invention may further include a heating step of heating the bump-formed plate-like member in the die cavity prior to the resin placement step. Then, the resin placement step may be performed in the die cavity in the state where the bump-formed plate-like member is heated.

In the transfer step, the bump-formed plate-like member may be transferred to the die cavity in the molding die in the state where the bump-formed plate-like member is placed on a release film so as to face the bump-formed surface upward. In this case, in the transfer step, the bump-formed plate-like member may be transferred to the die cavity in the molding die in the state where a frame is placed on the release film together with the bump-formed plated like member, and the bump-formed plate-like member is surrounded by the frame. In the resin placement step, it is preferred that the resin is placed on the bump-formed surface by supplying the resin in a space surrounded by the bump-formed plate-like member and the frame in the state where the frame is placed on the release film together with the bump-formed plated like member, and the bump-formed plate-like member is surrounded by the frame. In such case, the order of performing the resin placement step and the transfer step is not particularly limited. Any of them may be performed prior to the other, or both of them may be performed at the same time. However, it is preferred that the resin placement step is performed prior to the transfer step.

Moreover, the surface opposite to the bump-formed surface of the bump-formed plate-like member may be fixed on the release film by a pressure-sensitive adhesive.

A transfer means for performing the transfer step may be a means for transferring the resin to a die cavity in a molding die in the state where the plate-like member on which the resin is placed is placed on the release film. In this case, a resin-encapsulation means for performing the resin-encapsulation may include a means for adsorbing a release film and may be a means for performing the compression molding in the state where the release film is adsorbed to the means for adsorbing a release film. Although the molding die is not particularly limited, the molding die can be, for example, a gold die or a ceramics die.

The bump-formed plate-like member of the present invention is, as mentioned above, a bump-formed plate-like member for use in the production method of the present invention, wherein the bump(s) is formed on the plate-like member. The number of the bump(s) and the shape of the bump(s) are not particularly limited as mentioned above. For example, as mentioned above, at least one bump may be the plate-like bump. As mentioned above, it is preferred that the plate-like bump has a through hole and a projection, the through hole penetrates the plate-like bump in the direction parallel with a plate surface of the plate-like member, and the projection projects at an end opposite to an end formed in the plate-like member in the direction perpendicular to the plate surface of the plate-like member. Moreover, for example, as mentioned above, at least one bump may be a through hole-formed bump. More specifically, as mentioned above, the through hole in the through hole-formed bump (12) may be a through hole (12$b$) penetrating the bump in the direction parallel with the plate surface of the plate-like member. Moreover, the through hole-formed bump may further include a projection (12$c$) projecting at an end opposite to an end (12$a$ side) formed in the plate-like member in the direction perpendicular to the plate surface of the plate-like member. Furthermore, as mentioned above, at least one bump may be a columnar bump having a columnar shape (e.g., a cylindrical shape, a prismatic shape, a cone shape, a pyramid shape, a truncated cone shape, or a truncated pyramid shape).

As mentioned above, although the shape of the plate-like member is not particularly limited, the plate-like member may have a resin containing portion, for example. More specifically, for example, the resin containing portion may be formed in a central part of the plate-like member by a protuberance of an outer edge of the plate-like member toward the bump-formed surface of the plate-like member. Moreover, in the resin placement step of the production method of the present invention, the resin may be placed in the resin containing portion of the plate-like member, and the resin-encapsulation step may be performed in the state where the resin is placed in the resin containing portion.

In the case where compression molding is used, in the resin-encapsulation step, the substrate in which the electronic component(s) is arranged on the wiring pattern-formed surface may be placed on a substrate placement stage so as to face the wiring pattern-formed surface upward, and the resin may be pressed in the state where the resin is placed on the wiring pattern-formed surface.

In the production method of the present invention, the resin is not particularly limited, and for example, the resin may either be a thermoplastic resin or a thermosetting resin. The resin may be at least one selected from the group consisting of a granular resin, a powdery resin, a liquid resin, a plate-like resin, a sheet-like resin, a film-like resin, and a paste-like resin, for example. Further, the resin may be at least one selected from the group consisting of a transparent resin, a translucent resin, and an opaque resin, for example.

The examples of the present invention are described below with reference to the drawings. Each drawing is schematically illustrated by appropriately omitting, exaggerating, and the like for convenience in explanation.

EXAMPLES

Example 1

In the present example, an example of a bump-formed plate-like member of the present invention, an example of a resin-encapsulated electronic component of the present invention using the bump-formed plate-like member, and an example of a method for producing the resin-encapsulated electronic component using transfer molding are described.

Figure 1B:
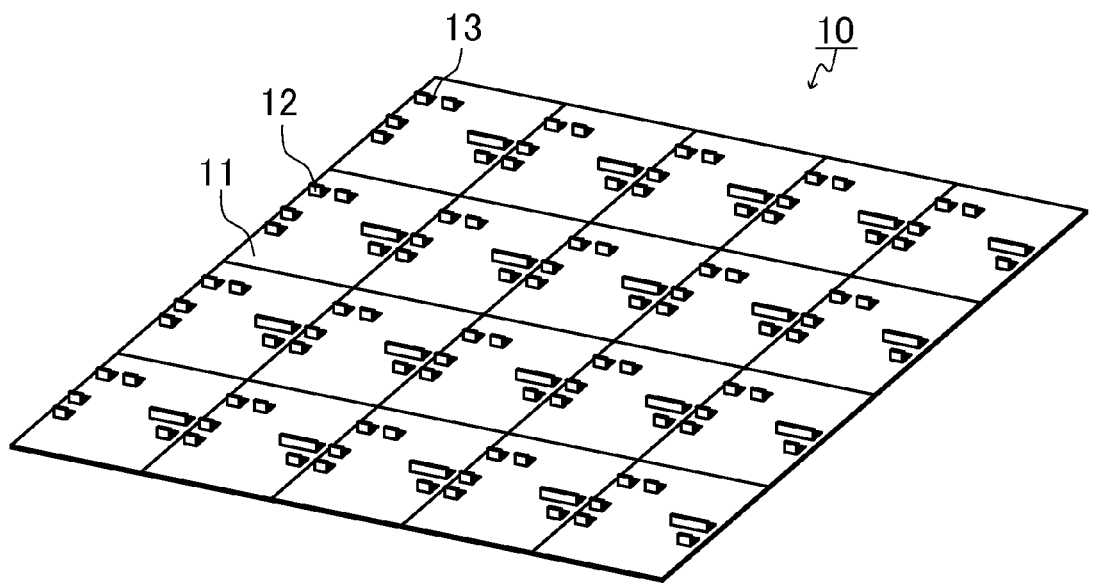

A structure of the bump-formed plate-like member in the present example is schematically shown in perspective views of FIGS. 1A and 1B. As shown in FIGS. 1A and 1B, this bump-formed plate-like member 10 is formed by forming a pattern of a bump(s) 12 in a plate-like member 11. Although the length (height) of the bump(s) 12 is not particularly limited, the length can be set appropriately according to the thickness of a completed resin-encapsulated electronic component (molded package), for example. In the present invention, the pattern of the bump(s) is not limited to the pattern of the present example (FIGS. 1A and 1B) and may be any pattern.

There are two types of the structures of the bump-formed plate-like member shown in the perspective views of FIGS. 1A and 1B. First, as shown in FIG. 1A, in this bump-formed plate-like member 10, a pattern of the bump(s) 12 is formed on the metal plate (plate-like member) 11 in the direction perpendicular to the direction of the surface of the metal plate (plate-like member) 11. On the other hand, in FIG. 1B, in the bump-formed plate-like member 10, a part of the metal plate (plate-like member) 11 is blanked and bent in the direction perpendicular to the direction of the surface of the plate-like member 11 to form the bump(s). In the plate like member 11, the blanked part forms a hole 13 as shown in FIG. 1B. The other part is the same as in FIG. 1A.

Figure 2:
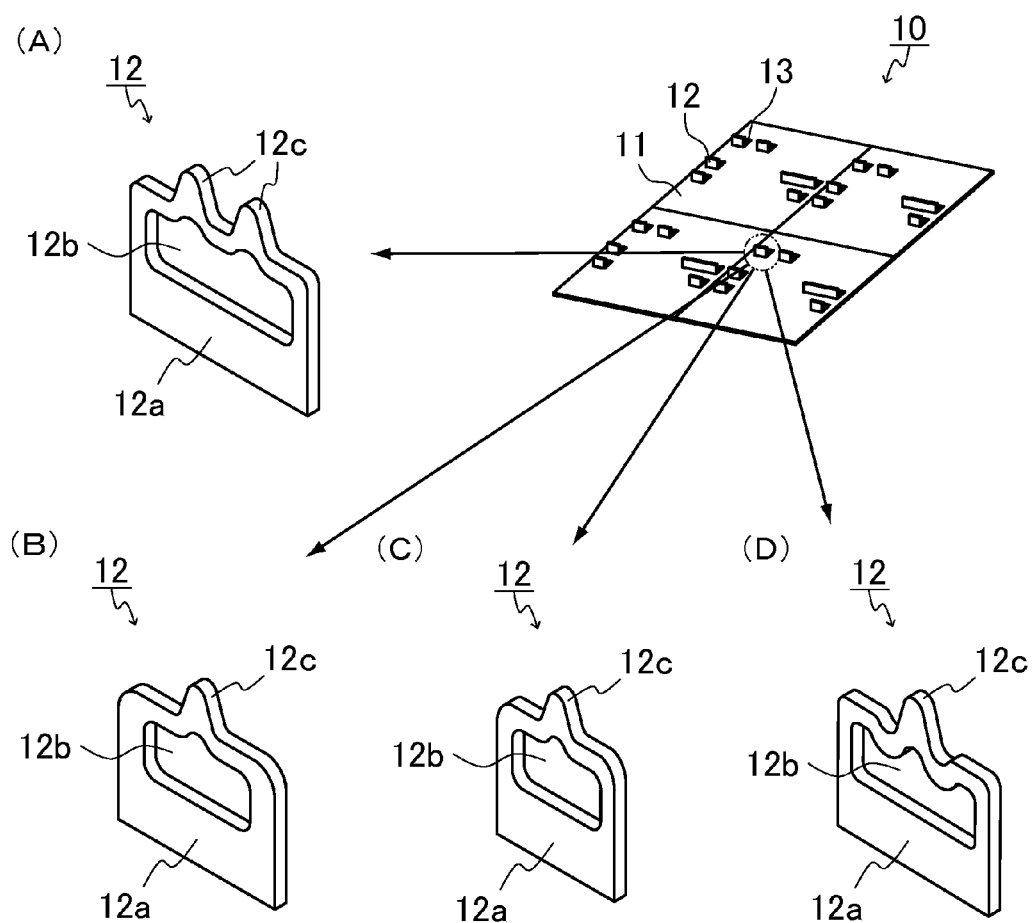
FIG. 2 shows perspective views showing, as examples, the structures of a bump in a bump-formed plate-like member of the present invention.

In FIGS. 1A and 1B, although the shape of the bump(s) 12 is not particularly limited, and is, for example, a shape shown in any of FIG. 2. In FIG. 2, an upper right drawing is a perspective view showing a part of the bump-formed plate-like member 10 of FIGS. 1A and 1B. Each of (A) to (C) in FIG. 2 is a perspective view schematically showing an example of the structure of a bump 12. As shown in each of (A) to (C) in FIG. 2, a lower part 12a of the bump 12 (connected to a plate-like member 11) has no hole. On the other hand, an upper part of the bump 12 (on the side opposite to the side of connecting to the plate-like member 11) has a hole (through hole) 12b penetrating the bump 12 in the direction parallel with the plate surface of the plate-like member 11. An upper end of the bump 12 (opposite to the end formed in the plate-like member 11) is partially projected toward an upper direction (direction perpendicular to the plate surface of the plate-like member 11) to form a projection 12c. The bump 12 can be in contact with a wiring pattern of a substrate (substrate electrode) at the tip of the projection 12c. In (A) in FIG. 2, the number of projections 12c is two. In (B) in FIG. 2, the number of projections 12c is one, and the projection 12c is the same as in (A) in FIG. 2 except that the width of the bump 12 is slightly narrower. In (C) in FIG. 2, the projection 12c is the same as in (B) in FIG. 2 except that the width of the bump 12 is further narrower. As described above, the number of projections 12c is not particularly limited and may be one or more. Although the number of projections 12c is one or two in (A) to (C) in FIG. 2, the number may be three or more. Although the number of holes (through holes) 12b is one in (A) to (C) in FIG. 2, the number is not particularly limited and may be any number, and there may be plural holes 12b.

When the bump(s) has a projection(s) 12c, the bump(s) 12 is prone to be in contact with the wiring pattern (substrate electrode) in the substrate without being interfered by the resin. That is, by the projection(s) 12c, the tip of the projection(s) 12c comes into contact with (is physically in contact with) and is electrically connected to the wiring pattern 22 through the resin (e.g., a molten resin or a liquid resin) between the bump(s) 12 and the wiring pattern 22 in FIGS. 1A and 1B. Moreover, when the bump(s) 12 has hole(s) 12b, the resin-encapsulation of the electronic component(s) is performed more easily. That is, the resin can flow through the hole(s) 12b, so that the resin flows smoothly, and the efficiency of the resin-encapsulation is further improved. This effect is especially prominent in the case of transfer molding. Moreover, when the bump(s) 12 comes into contact with (is in contact with) the wiring pattern 22, the bump(s) 12 is bent around the hole(s) 12b as shown in (D) in FIG. 2. Thus, the height (length) of the bump(s) 12 can be reduced. Thus, the height of the bump(s) 12 can be adjusted according to the thickness of the resin (the thickness of the package) in the resin-encapsulated electronic component. Considering this point, the height (length) of the bump(s) 12 may be set to be slightly longer than the thickness of the resin (the thickness of the package) in advance.

The shape of the bump(s) 12 can be another shape in addition to or as substitute for the shapes shown in (A) to (C) in FIG. 2. For example, as mentioned above, at least one bump 12 may be a columnar bump having a columnar shape. Examples of the shape of the columnar bump include, as mentioned above, a cylindrical shape, a prismatic shape, a cone shape, a pyramid shape, a truncated cone shape, and a truncated pyramid shape.

Moreover, as mentioned above, at least one bump 12 may be a plate-like bump. In this case, as mentioned above, in the resin-encapsulation step of the production method of the present invention, the substrate may be partitioned into plural regions with the plate-like bump, and the resin-encapsulation of the electronic component(s) may be performed in the regions. Moreover, the plate-like bump may have a through hole and a projection as in the bumps shown in (A) to (C) in FIG. 2. The through hole may penetrates the plate-like bump in the direction parallel with the plate surface of the plate-like member as in (A) to (C) in FIG. 2. Moreover, the projection preferably projects at the end opposite to an end formed in the plate-like member in the direction perpendicular to the plate surface of the plate-like member as in (A) to (C) in FIG. 2. The number of through holes and the number of projections in the plate-like bump are not particularly limited and may be any numbers, and there are preferably plural through holes and plural projections. When the plate-like bump has the through hole and the projection, the same advantageous effect as the through hole 12b and the projection 12c shown in (A) to (C) in FIG. 2 can be obtained. That is, first, when the plate-like bump has the projection, the plate-like bump is more easily in contact with the wiring pattern (substrate electrode) in the substrate without being interfered by the resin. When the plate-like bump has the through hole, the resin can flow through the through hole, so that the resin flows smoothly, and the efficiency of the resin-encapsulation is further improved. This effect is especially prominent in the case of transfer molding. Moreover, when the plate-like bump is bent around the through hole, the height (length) of the plate-like bump can be reduced. Thus, the height of the plate-like bump can be adjusted according to the thickness of the resin (the thickness of the package) in the resin-encapsulated electronic component. Considering this point, the height (length) of the plate-like bump may be set to be slightly longer than the thickness of the resin (the thickness of the package) in advance.

Although examples of the method for producing a bump-formed plate-like member of the present invention include a method in which a bump-formed plate-like member is produced by joining a plate-like member (metal plate) to a bump(s) and a method in which bump(s) are formed by using a metal plate as a plate-like member and blanking and bending the metal plate, the method is not limited thereby. Specifically, for example, the bump-formed plate-like member shown in FIG. 1A may be produced, according to a general technique, by any of the following methods (1) to (6):

(1) A method in which a bump-formed plate-like member is produced by etching a metal plate;
(2) A method in which a bump-formed plate-like member is produced by joining a plate-like member to a bump(s);
(3) A method in which a plate-like member and a bump(s) are molded at the same time by electroforming;
(4) A method in which a plate-like member and a bump(s) are molded at the same time by a resin having conductivity (shielding properties);
(5) A method in which a bump-formed plate-like member is produced by joining a resin (plate-like member) having conductivity (shielding properties) to a bump(s); and
(6) A method in which a resin plate and a substance having a projection are provided with a coating film having conductivity (shielding properties).

The method for producing a bump-formed plate-like member of the present invention is not particularly limited as mentioned above. For example, the bump-formed plate-like member shown in FIG. 1B may be produced, according to a general technique, by the following method (7):

(7) A method in which a bump(s) is produced by using a metal plate as a plate-like member and blanking and bending the metal plate.

Figure 3:
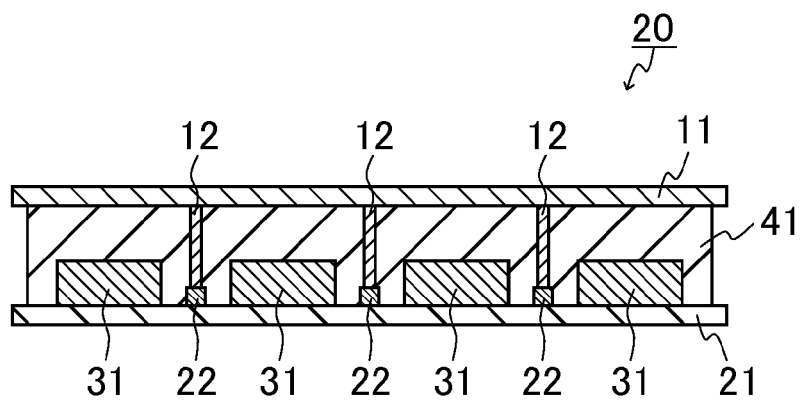
FIG. 3 is a cross-sectional view showing an example of the structure of a resin-encapsulated electronic component of the present invention.

The structure of the resin-encapsulated electronic component of the resent example produced using the bump-formed plate-like member of FIGS. 1A and 1B is schematically shown in a cross-sectional view of FIG. 3. As shown in FIG. 3, this resin-encapsulated electronic component 20 includes: a substrate 21; electronic components 31; a resin 41; a plate-like member 11; and bumps 12. The bumps 12 are formed on the plate-like member 11, so that the plate-like member 11 and the bumps 12 are integrated to form a bump-formed plate-like member. The electronic components 31 are fixed on the substrate 21 and are encapsulated in the resin 41. A wiring pattern 22 is formed on the side on which the electronic components 31 are formed on the substrate 21. As described for FIGS. 1A and 1B, the bumps 12 are formed on the plate-like member 11. Moreover, the bumps 12 penetrate the resin 41 and are in contact with the wiring pattern 22.

The plate-like member 11 is not particularly limited and may be, for example, as mentioned above, a heat radiation plate or a shield (shield plate). For example, in the case where plural chips (electronic components) are arranged in one IC (resin-encapsulated electronic component), each chip may be electromagnetically shielded with a shield (shield plate) based on the relationship among functions of the chips.

Moreover, although the bump-formed plate-like member may be a plate-like member corresponding to one substrate (one resin-encapsulated electronic component), it may be a (matrix-type) plate-like member corresponding to plural substrates (plural resin-encapsulated electronic components) as shown in FIGS. 1A and 1B. In the case of the matrix type, for example, plural substrates on each of which an electronic component(s) and a wiring pattern are fixed are subjected to resin-encapsulation together with the matrix-type bump-formed plate-like member. The matrix-type bump-formed plate-like member may thereafter be partitioned into regions corresponding to the respective substrates by cutting or the like. Moreover, for example, as mentioned above, at least one bump may be a plate-like bump. In this case, a required area (an area having a specific function) corresponding to one resin-encapsulated electronic component (one product unit) on the surface of the substrate can be partitioned (divided) with the plate-like bump.

Moreover, the electronic components 31 may be in a form in which electronic components have been already subjected to resin-encapsulation (i.e., resin-encapsulated electronic components). In this case, the resin-encapsulated electronic component 20 is in a form in which the resin-encapsulated electronic components 31 have been further subjected to resin-encapsulation. Thus, electronic components are subjected to resin-encapsulation plural times.

Figure 4:
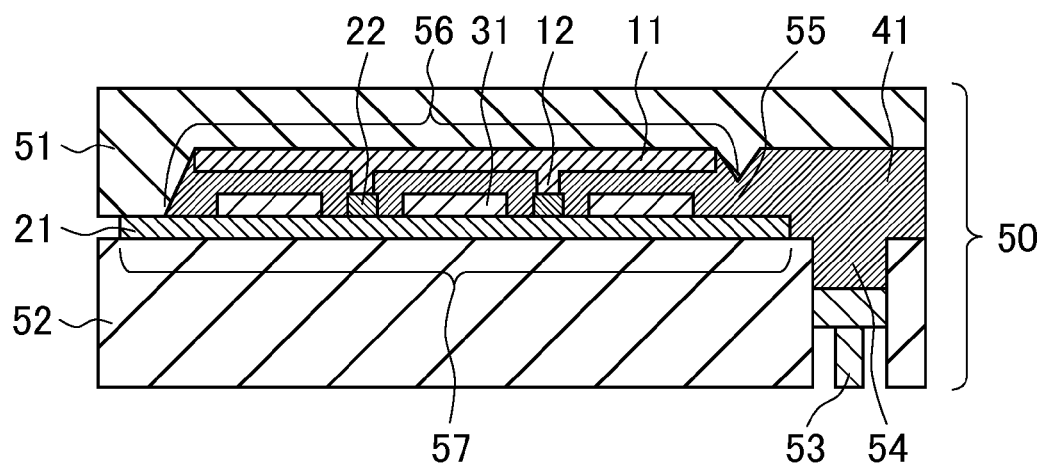
FIG. 4 is a cross-sectional view showing an example of the production method of the present invention using transfer molding.

An example of a method for producing an electronic component shown in FIG. 3 is schematically shown in the cross-sectional view of FIG. 4. This production method is, as mentioned above, a production method using transfer molding.

As shown in FIG. 4, this production method can be performed using a molding die 50 for general transfer molding. As shown in FIG. 4, the molding die 50 is formed of an upper die 51 and a lower die 52. The molding die is configured so that the die surface of the upper die 51 is provided with a die cavity 56 for resin molding, and the die surface of the lower die 52 is provided with a substrate set part 57 that supplies and sets a substrate 21 that is provided with electronic components 31 and a wiring pattern 21.

The lower die 52 is provided with a pot (hole) 54 for supplying a resin material, and a plunger 53 for resin pressurization is fit into the pot.

The method for transfer molding using the device shown in FIG. 4 is not particularly limited, and transfer molding may be performed according to a general method for transfer molding. That is, the method is configured as follows. First, a resin material such as a resin tablet is supplied to the pot 54, the substrate 21 is supplied and set in the substrate set part 57, and both of the upper die 51 and the lower die 52 are clamped. Subsequently, the resin is heated and melted in the pot 54, and a molten resin 41 in the pot 54 is pressurized by moving the plunger 53 upward to cause the molten resin to pass through the resin passage (cull, runner, gate) 55 from the pot 54 of the lower die 52 so that the molten resin can be injected into the die cavity 56 of the upper die 51. At that time, a required resin pressure can be applied to the resin in the die cavity 56 by the plunger 53.

After the elapse of time required to cure, the upper die 51 and the lower die 52 are unclamped, so that the electronic components 31 and the like can be encapsulated and molded in the package (resin molded article) having a shape corresponding to the shape of the cavity in the mold cavity 56 (see the resin-encapsulated electronic component 20 shown in FIG. 3).

In the present example, the production method shown in FIG. 4 (production of the resin-encapsulated electronic component 20 shown in FIG. 3) can be performed as described below, for example. That is, first, a substrate 21 provided with electronic components 31 and a wiring pattern 22 is arranged at a position corresponding to the position of a die cavity of the upper die 51 on the die surface (substrate set part) of a lower die 52. Then, a plate-like member 11 and bumps 12 are arranged thereon so as to be at the same position as the completed resin-encapsulated electronic component 20 (FIG. 3). At that time, as shown in FIG. 4, the surface of the substrate 21, opposite to the electronic component 31-arranged surface is caused to be in contact with the lower die 52, so that a bump-formed plate-like member (the plate-like member 11 and the bumps 12) is placed on the electronic component 31-arranged surface, and the wiring pattern 22 is physically electrically connected to the tips of the bumps 12.

The substrate 21, the electronic components 31, the plate-like member 11, and the bumps 12 may be placed on the die surface of the lower die 52 in the state of being upside down in FIG. 4. That is, the surface of the plate-like member 11, opposite to the bump 12-formed surface may be caused to be in contact with the lower die 52, and the substrate 21 and the electronic components 31 may be arranged on the bump 12-formed surface.

Subsequently, as shown in FIG. 4, the upper die 51 and the lower die 52 are clamped. As that time, the upper die 51 is placed on the lower die 52, and the substrate 21, the electronic components 31, the plate-like member 11, the bumps 12 are contained in the die cavity of the upper die, and the plate-like member 11 comes into contact with the upper surface of the die cavity.

In this state, as shown in FIG. 4, a resin 41 is injected from the pot 54 of the lower die 52 into the die cavity of the upper die 51 through the resin passage 55 by the plunger 53. Thus, the electronic components 31 arranged on the substrate 21 are subjected to resin-encapsulation together with the plate-like member 11 and the bumps 12. Accordingly, the resin-encapsulated electronic component 20 shown in FIG. 3 can be produced.

At the time of injecting the resin into the die cavity 56, in the die cavity 56, the resin (molten resin) 41 can flow between the bumps 12 and can pass through the holes 12b of the bumps 12.

Although the method in which clamping is performed after placing both of the substrate and the bump-formed plate-like member on the die surface of the lower die is described above, the present invention is not limited thereby. For example, the substrate 21 may be supplied to and set on the die surface of the lower die 52, the bump-formed plate-like member (plate-like member 11) may be attached to the upper surface of the die cavity of the upper die 51, the upper die 51 and the lower die 52 may be clamped, and the resin may be injected into the die cavity. At that time, as mentioned above, the plate-like member 11 and the substrate 21 may be upside down.

At the time of molding (resin-encapsulation) in transfer molding, for example, the transfer molding may be performed with setting of the degree of vacuum in the die cavity to the predetermined degree. The method for setting the degree of vacuum to the predetermined degree is not particularly limited and may be, for example, performed according to the method in general transfer molding.

A device for use in the transfer molding is not particularly limited and may be, for example, the same as a general device for transfer molding. Specific conditions of the resin-encapsulation step are not particularly limited and may be, for example, the same as those in general transfer molding.

In order to connect between the bumps 12 and the wiring pattern 22 more securely, solders may be arranged between the bumps 12 and the wiring pattern 22 in advance. In this case, for example, the solders may be melted by reflow or the like after the resin-encapsulation step to join the bumps 12 and the wiring pattern 22. The same applies to the following examples.

According to the present invention, it is not required to bore a hole for via formation (a groove or a hole) in the resin as described above. Thus, for example, the following effects (1) to (5) can be obtained. These effects, however, are mere examples and does not limit the present invention.
(1) There is no possibility that the depth and the like of a hole for via formation are not correctly appropriately formed on a wiring pattern of a substrate due to variations in thickness of the resin-encapsulated electronic component (package) and the like because it is not required to bore a hole for via formation in the resin.
(2) Fillers contained in a resin material do not remain on a wiring pattern of a substrate because it is not required to bore a hole for via formation in the resin.
(3) Damage is not caused to a wiring pattern on an electronic component-mounted substrate because it is not required to bore a hole for via formation in the resin.
(4) The conditions under which a resin-encapsulated electronic component is produced are not influenced by the filler density of the resin material because it is not required to bore a hole for via formation in the resin.
(5) By the effects (1) to (4), a resin-encapsulated electronic component can be simply and efficiently produced, and a yield is favorable. Moreover, a connection between the wiring pattern in the substrate and the bump(s) (via electrode(s)) and the like become favorable, which contributes to an improvement in performance of the resin-encapsulated electronic component, a reduction in defect rate, or the like.

Example 2

In FIGS. 5 to 8, another example of the present invention is described. In the present example, an example of a method for producing a resin-encapsulated electronic component using compression molding is described.

Figure 5:
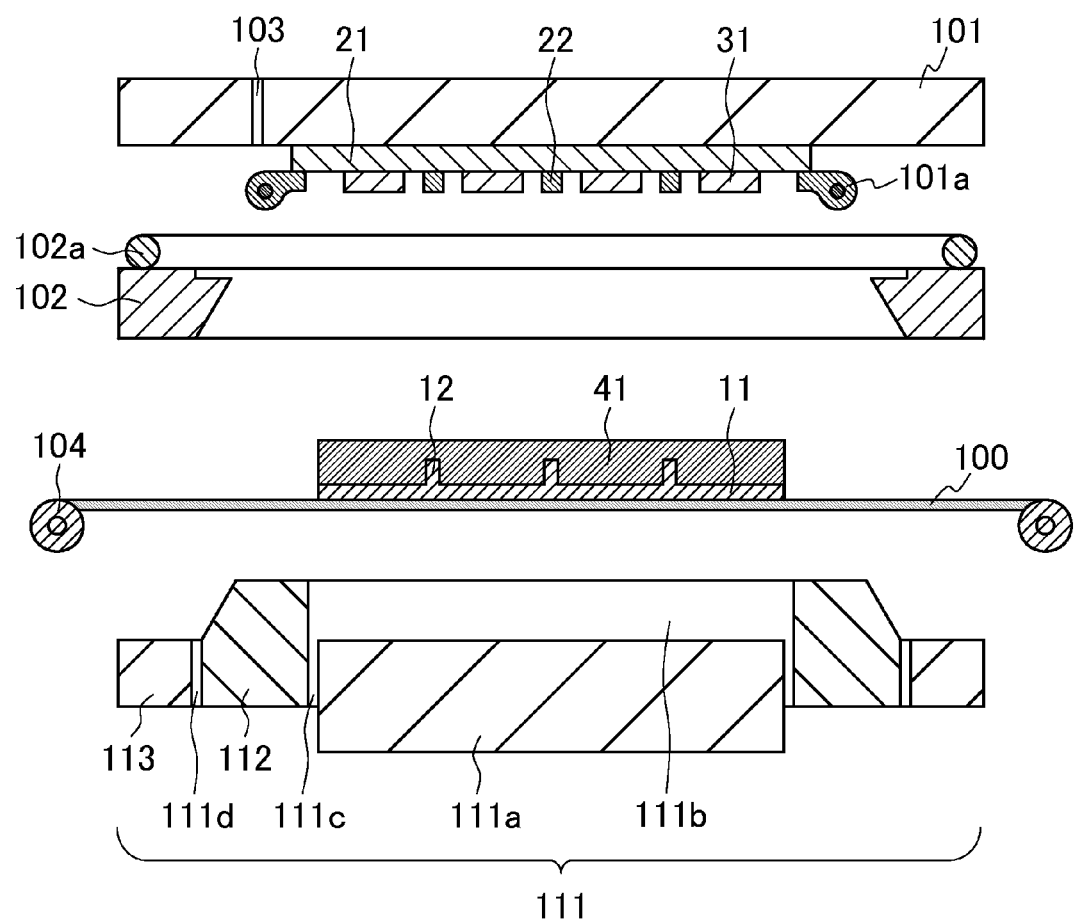
FIG. 5 is a cross-sectional view showing an example of a step in an example of the production method of the present invention using compression molding.

First, a compression molding device (a device for producing a resin-encapsulated electronic component) is provided. The step cross-sectional view of FIG. 5 shows the structure of a part of a molding die that is a part of the compression molding device. As shown in FIG. 5, this compression molding device includes, as main components, an upper die 101, a lower die 111, and an intermediate die (intermediate plate) 102. The lower die 111 includes a lower die cavity bottom member 111a and lower-die peripheral end retainers (main body of the lower die) 112 and 113. The lower-die peripheral end retainers (main body of the lower die) 112 and 113 are frame-shaped lower die cavity side members. More specifically, the lower-die peripheral end retainer 112 is arranged so as to surround the periphery of the lower die cavity bottom member 111a, and the lower-die peripheral end retainer 113 is arranged so as to surround the periphery of the lower-die peripheral end retainer 112. There is a gap (adsorption hole) 111c between the lower die cavity bottom member 111a and the lower-die peripheral end retainer 112. There is a gap (adsorption hole) 111d between the lower-die peripheral end retainers 112 and 113. These gaps 111c and 111d are evacuated with a vacuum pump (not shown) as mentioned below, and thus a release film and the like can be adsorbed. The height of the upper surface of the lower-die peripheral end retainer 112 is higher than the heights of the upper surfaces of the lower die cavity bottom member 111a and a lower-die peripheral end retainer 113. Thus, a lower die cavity (concave portion) 111b surrounded by the upper surface of the lower die cavity bottom member 111a and the inner peripheral surface of the lower-die peripheral end retainer 112 is formed. The upper die 101 has a hole (through hole) 103. As mentioned below, at least the lower die cavity 111b can be evacuated by suction from the hole 103 with a vacuum pump (not shown) after clamping. The intermediate die (intermediate plate) 102 has a frame shape (ring shape) and is arranged so as to be positioned immediately above the lower-die peripheral end retainer 113. A release film 100 can be held between the lower surface of the intermediate die 102 and the upper surface of the lower-die peripheral end retainer 113, so that the release film 100 can be fixed. An O ring 102a having elasticity is attached to an outer edge in the upper surface of the inner mediate die 102. As shown in FIG. 5, this compression molding device has rolls 104 on both sides in FIG. 5. Both ends of one long release film 100 are wound onto the rolls 104 on the both sides. The release film 100 can be delivered from right to left or from left to right in FIG. 5 by the rolls 104 on the both sides. Thus, as mentioned below, the bump-formed plate-like member can be transferred to the position of the lower die cavity in the state where the bump-formed plate-like member is placed on the release film 100. That is, the rolls 104 correspond to transfer means for transferring the bump-formed plate-like member to the position of a die cavity in a molding die. This compression molding device (device for producing a resin-encapsulated electronic component) further includes a resin placement means, although it is not shown. The resin placement means causes a resin to be placed on the bump-formed surface of the bump-formed plate-like member.

Subsequently, as shown in FIG. 5, a substrate 21 fixed on one surfaces of electronic components 31 is fixed on the lower surface of the upper die 101 by a clamper 101a. At that time, the fixation is performed so that the electronic component 31-fixed surface of the substrate 21 faces downward. The substrate 21 and the electronic components 31 are the same as those in Example 1, and a wiring pattern 22 is formed in the substrate 21 as in Example 1. Further, by the resin placement means, as shown in FIG. 5, a resin 41 is placed on the bump 12-formed surface of a plate-like member 11 (resin placement step). The plate-like member 11, the bumps 12, and the resin 41 are the same as those in Example 1. Although the form of the resin 41 is not particularly limited, it is preferred that the resin 41 is not fallen from the bump 12-formed surface of the plate-like member 11 in the resin placement step. For example, in the resin placement step, a sheet-like resin 41 may be laminated and pressed on the bump 12-formed surface of the plate-like member 11. Moreover, as shown in FIG. 5, the plate-like member 11 on which the resin 41 is placed is placed on the release film 100. At that time, as shown in FIG. 5, the placement is performed so that the resin 41-placed surface (the bump 12-formed surface) of the plate-like member 11 faces upward (i.e., the surface opposite to the bump 12-formed surface is in contact with the upper surface of the release film 100). A pressure-sensitive adhesive (adhesive layer) may be present between the upper surface of the release film 100 and the plate-like member 11, and the plate-like member 11 may be fixed on the upper surface of the release film 100 by the pressure-sensitive adhesive (adhesive layer), although it is not shown. As described above, the presence of the pressure-sensitive adhesive (adhesive layer) is preferable because there is an advantage in that the resin 41 is less prone to be leaked from the hole 13 even in the case where the plate-like member 11 has the hole 13 as shown in FIG. 1B and the like, for example. Furthermore, as shown in FIG. 5, the resin 41 is transferred to the position of the lower die cavity 111b together with the plate-like member 11, the bumps 12, and the release film 100 by the transfer means.

Figure 6:
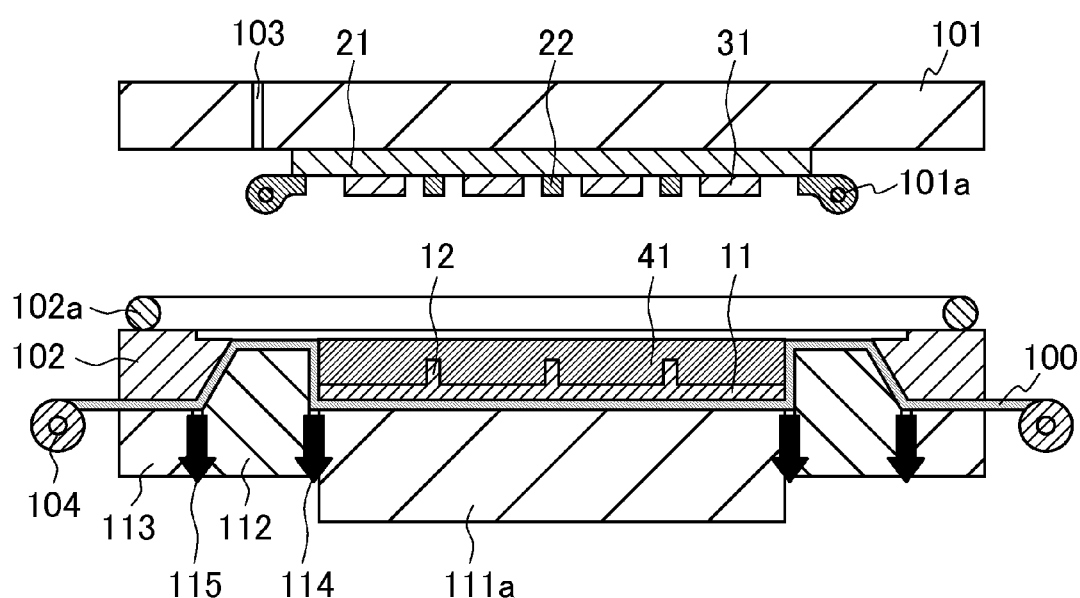
FIG. 6 is a cross-sectional view showing an example of another step in the same production method as in FIG. 5.

Subsequently, as shown in an arrow 114 of FIG. 6, a space (gap 111c) between the lower die cavity bottom member 111a and the lower-die peripheral end retainer 112 is evacuated with a vacuum pump (not shown). Along with the evacuation, as shown in an arrow 115 of FIG. 6, a space (gap 111d) between the lower-die peripheral end retainer 112 and the lower-die peripheral end retainer 113 is evacuated with a vacuum pump (not shown). Moreover, the intermediate die 102 is caused to move downward together with the O ring 102a, and the release film 100 is held between the lower surface of the intermediate die 102 and the upper surface of the lower-die peripheral end retainer 113. Thus, the release film 100 is fixed on the upper surfaces of the lower-die peripheral end retainer 112 and the lower-die peripheral end retainer 113. The surface of the lower die cavity 111b can be covered with the release film 100 by the evacuation indicated by the arrow 114 of the lower die cavity 111b. Thus, as shown in FIG. 6, the resin 41 can be placed on the surface of the lower die cavity in the state where the resin 41 is placed on the plate-like member 11.

Figure 7:
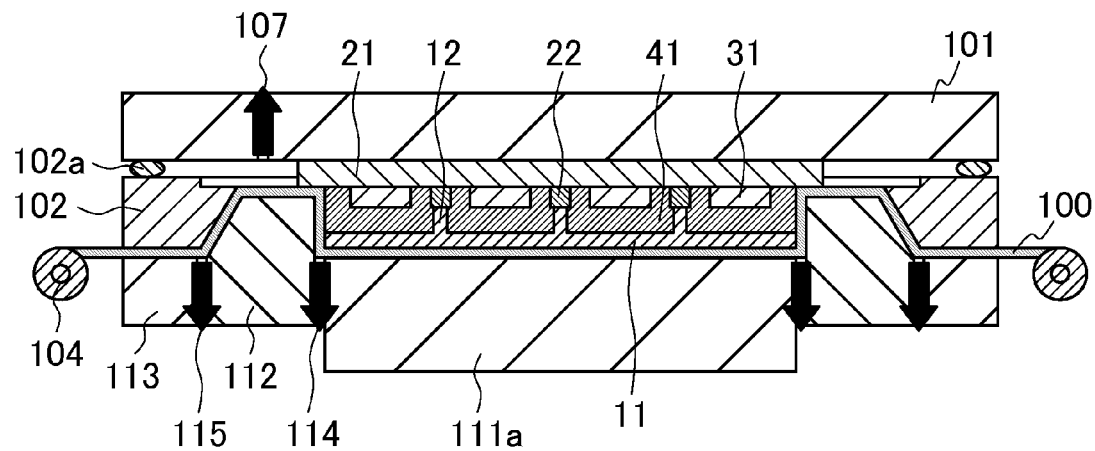
FIG. 7 is a cross-sectional view showing an example of yet another step in the same production method as in FIG. 5.
Figure 8:
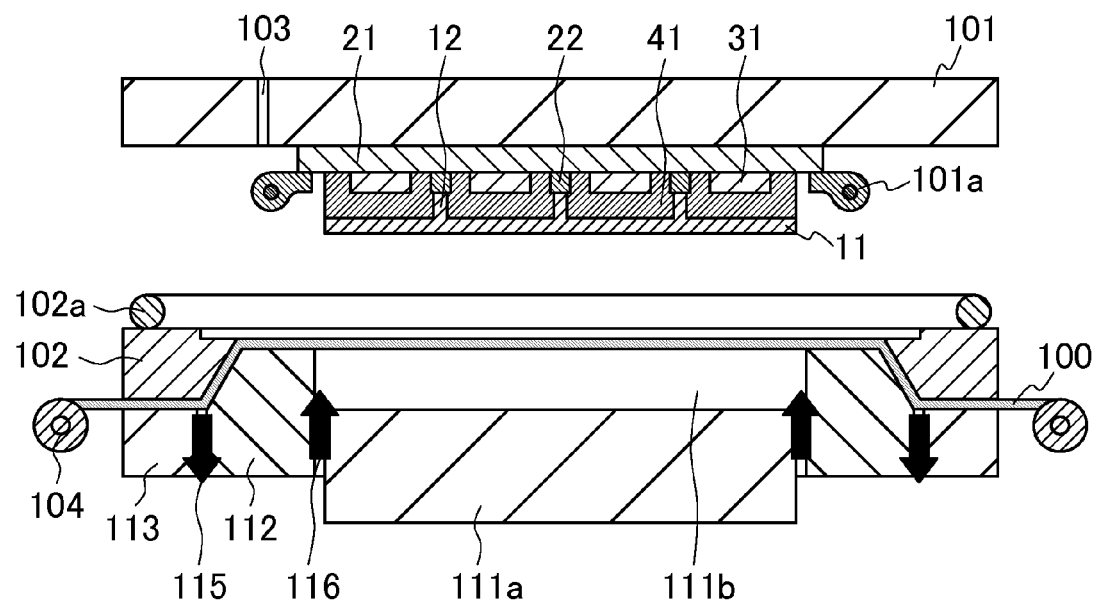
FIG. 8 is a cross-sectional view showing an example of yet another step in the same production method as in FIG. 5.

Next, the resin-encapsulation step is performed as shown in FIGS. 7 and 8. In FIG. 7, illustration of a clamper 101a is omitted as a matter of convenience.

That is, first, as shown in FIG. 7, a lower die 111 (lower die cavity bottom member 111a and lower-die peripheral end retainers 112 and 113) is lifted together with an intermediate die 102 and an O ring 102a for exclusion of outside air. At that time, by joining the die surface of an upper die 101 and an upper surface die of the O ring 102a, the inside of at least the lower die cavity 111b can be set in the state of excluding outside air, and an outside air-excluding space can be formed in each of the upper die, the lower die, and the intermediate die (three dies). In this state, as shown in an arrow 107, at least the lower die cavity 111b (outside air-excluding space) is subjected to suction through a hole 103 of the upper die 101 with a vacuum pump (not shown) to evacuate. Furthermore, the lower die 111 and the intermediate die 102 are integrally lifted. At that time, the upper surface of the lower-die peripheral end retainer 112 (lower die 111) and the surface of the substrate 21 can be joined via a release film 100.

Subsequently, the lower die cavity bottom member 111a is lifted. At that time, a resin 41 is in the state of having fluidity. Therefore, first, the electronic components 31 can be immersed in the resin 41 in the lower die cavity 111b, and then, the resin 41 in the lower die cavity 111b can be pressurized by the lower die cavity bottom member 111a. Accordingly, the electronic components 31 (including bumps and a wiring pattern 22) attached to the substrate 21 in the lower die cavity 111b can be subjected to compression molding (resin-molding) in a molded package (resin molded article) 41 corresponding to the shape of the lower die cavity 111b. At that time, the plate-like member 11 is in the state of being attached to the upper surface side of the molded package 41, opposite to the substrate 21. At that time, there may be a small clearance (gap) between the substrate 21 and the release film 100.

In this state, as shown in the arrow 107, at least the lower die cavity 111b is subjected to suction through the hole 103 of the upper die 101 with a vacuum pump (not shown) to evacuate. Then, in the state, the resin 41 is subjected to compression molding together with the plate-like member 11, the bumps 12, the electronic components 31, and the substrate 21 to perform resin-encapsulation of the electronic components 31. At that time, the bumps 12 are caused to be in contact with the wiring pattern 22 formed on the substrate 21. A resin-encapsulated electronic component can be produced by performing the "resin-encapsulation step" as described above.

As mentioned above, when the electronic components 31 are immersed in the resin 41 that is in the lower die cavity 111b, the resin 41 is in the state of having fluidity. The resin 41 having fluidity may be, for example, a liquid resin (thermosetting resin or the like before being cured) or a resin in the molten state obtained by heating a solid resin such as a granular resin, a powdery resin, or a resin paste to melt. The resin 41 can be heated through heating the lower die cavity bottom member 111a or the like, for example. For example, in the case where the resin 41 is a thermosetting resin, the resin 41 in the lower die cavity 111b may be heated and then thermally cured by pressurization. Thus, resin-encapsulation molding (compression molding) of the electronic components 31 can be performed in the resin molded article (package) corresponding to the shape of the lower die cavity. As described above, for example, the resin-encapsulation molding can be performed in the state where the plate-like member 11 is exposed to the upper surface (the surface on the side opposite to the substrate) of the resin molded article (package).

After the compression molding (resin-encapsulation), i.e., after curing the resin 41, as shown in FIG. 8, the lower die 111 (lower die cavity bottom member 111a and lower-die peripheral end retainers 112 and 113) is caused to move downward together with the intermediate die 102 and the O ring 102a. Thus, the lower die cavity 111b is opened and released from being evacuated. As that time, the depressurization (evacuation) of the gap between the lower die cavity bottom member 111a and the lower-die peripheral end retainer 112 is released. As shown in an arrow 116, air may be delivered to the gap. Accordingly, as shown in FIG. 8, the release film 100 is separated from the upper surface of the lower die cavity bottom member 111a. At that time, the depressurization (evacuation) of the gap between the lower-die peripheral end retainers 112 and 113 is not released. Moreover, the intermediate die 102 still holds the release film 100 together with the lower-die peripheral end retainer 113. Therefore, the release film 100 is, as shown in FIG. 8, continuously adsorbed to (fixed on) the upper surfaces of the lower-die peripheral end retainers 112 and 113. Moreover, the substrate 21 is continuously fixed on the lower surface (die surface) of the upper die 101 by a clamper 101a. Then, the resin 41 and the plate-like member 11 are subjected to compression molding together with the substrate 21 and the electronic components 31. Thus, the release film 100 is removed from the resin-encapsulated electronic component formed of the substrate 21, the plate-like member 11, the bumps 12, the electronic components 31, and the resin 41 by causing the lower die 111 to move downward. Subsequently, by the rolls 104, the release film 100 is unreeled (or reeled) in the right or left direction of FIG. 8.

In the present invention, for example, as shown in the present example, when resin-encapsulation of electronic components is performed, the entire bumps 12 are present in the resin 41 (a molten resin or a liquid resin) in the lower die cavity 111b. In this state, as mentioned above, when the lower die cavity bottom member 111a is moved upward, the tips of the bumps 12 and the wiring pattern 22 of the substrate 21 physically come into contact with each other and are connected to each other in the resin 41. Thus, for example, the tip of the bumps and the wiring pattern of the substrate can be easily connected to each other without causing the resin to enter between them, compared with the method in which a hole for via formation is bored after the resin-encapsulation of the electronic components. That is, there is an advantage in that the bumps and the wiring pattern of the substrate are prone to be electrically connected to each other. This is advantageous in view of shielding performance in the case where the plate-like member is a shield plate, for example. As shown in (A) to (D) in FIG. 2, the bumps 12 may be capable of being shrunk (the height may be capable of being reduced). That is, even when the heights of the bumps 12 are slightly higher than the thickness of the resin 41, it is possible to shrink the bumps 12 by elastically moving the projection 12c to the gap on the hole 12b side (downward) in the case where the tip of the projection 12c comes into contact with the wiring pattern 22. Thus, as mentioned above, the heights of the bumps 12 can be adjusted according to the thickness of the resin (the thickness of the package) in the resin-encapsulated electronic component.

Figure 9:
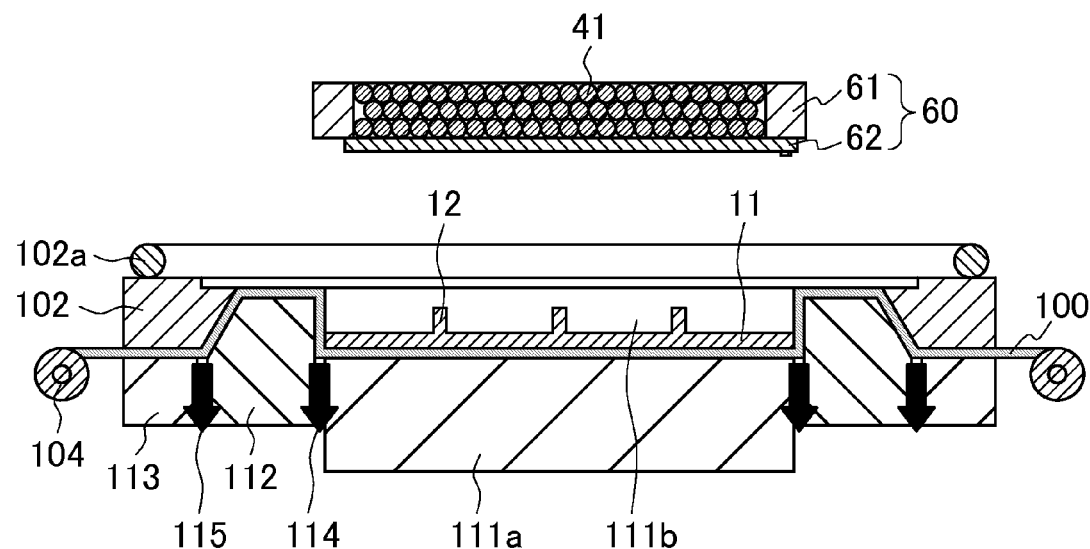
FIG. 9 is a cross-sectional view showing an example of a step in another example of the production method of the present invention using compression molding.
Figure 10:
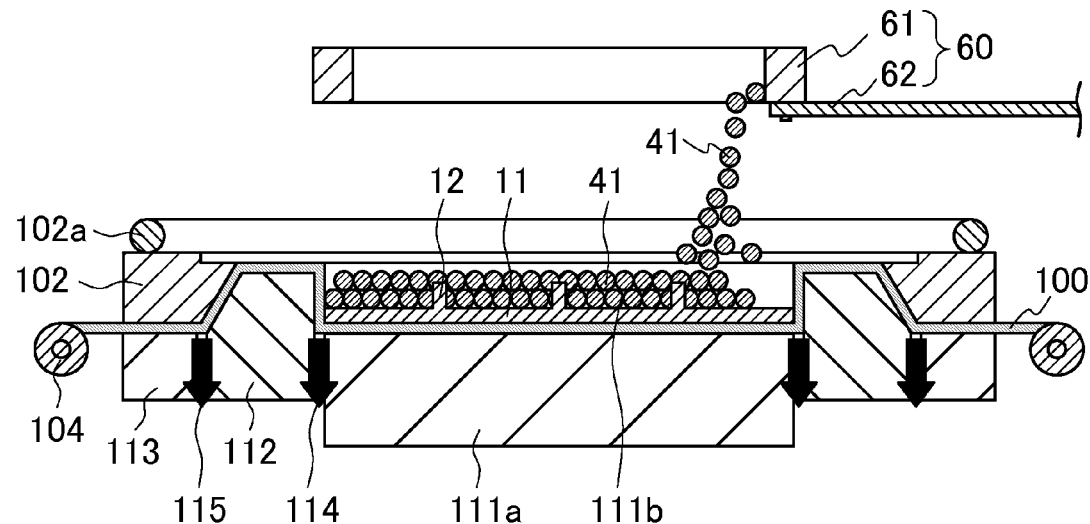
FIG. 10 is a cross-sectional view showing an example of another step in the same production method as in FIG. 9.
Figure 11:
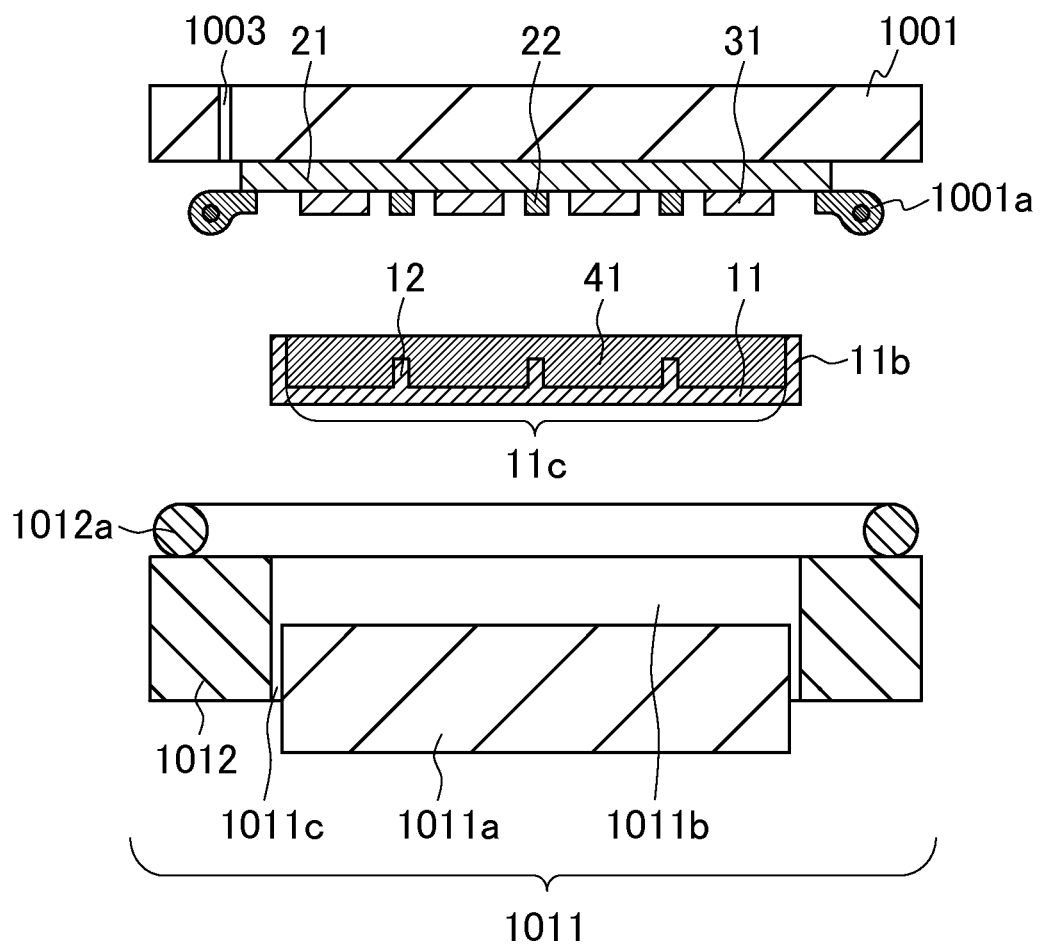
FIG. 11 is a cross-sectional view showing an example of a step in yet another example of the production method of the present invention using compression molding.

Next, FIGS. 9 and 10 are described. The method in which a "resin placement step" of placing a resin 41 on a plate-like member 11 is performed, and thereafter a "transfer step" of transferring a bump-formed plate-like member to a die cavity is described above with reference to FIGS. 5 to 8. As mentioned above, the order of performing the resin placement step and the transfer step, however, is not particularly limited. FIGS. 9 to 10 show an example of a method for producing a resin-encapsulated electronic component, including performing the resin placement step after the transfer step. As shown in FIGS. 9 to 10, a compression molding device (device for producing a resin-encapsulated electronic component) for use in this method is the same as the compression molding device (device for producing a resin-encapsulated electronic component) shown in FIGS. 5 to 8 except for having a resin supply means 60. In FIGS. 9 to 10, illustration of an upper die 101, a hole (through hole) 103 in the upper die, a clamper 101*a*, a substrate 21, a wiring pattern 22, and electronic components 31 are omitted for simplifying the drawings. As shown in FIGS. 9 and 10, the resin supply means 60 is composed of a resin supply section 61 and a lower shutter 62. The resin supply section 61 has a frame shape in which openings are formed at the upper end and the lower end. The opening at the lower end of the resin supply section (frame) 61 is closed with the lower shutter 62. Thus, as shown in FIG. 9, a resin 41 can be contained in a space surrounded by the resin supply section (frame) 61 and the lower shutter 62. In this state, as shown in FIG. 9, the resin supply means 60 is caused to enter immediately above a lower die cavity 111*b* (space between a lower die 111 and an upper die 101). Then, as shown in FIG. 10, the opening at the lower end of the resin supply section (frame) 61 is opened by pulling the lower shutter 62 to cause the resin 41 to move downward from the opening. Thus, the resin 41 can be supplied to (placed in) the lower die cavity 111*b*. Although the resin 41 is a granule resin in FIGS. 9 and 10, the resin 41 is not particularly limited thereto. In the resin placement step prior to the steps in FIGS. 5 to 8, the rein supply means 60 composed of the resin supply section 61 and the lower shutter 62 may be used as in FIGS. 9 to 10.

In the method shown in FIGS. 9 to 10, first, the same step as in FIGS. 5 to 6 is performed in the transfer step except that the resin 41 is not placed on the plate-like member 11. Thus, as shown in FIG. 9, a bump-formed plate-like member (plate-like member 11 and bumps 12) is placed on the cavity surface of the lower die cavity 111*b* (via a release film 100) in the same state as in FIG. 6 except that the resin 41 is not placed on.

Then, prior to the resin placement step, the bump-formed plate-like member is heated in the lower die cavity in the state shown in FIG. 9 (heating step). The heating can be performed by heating a lower die cavity bottom member 111*a* or the like. It is preferred that the bump-formed plate-like member is subjected to sufficient thermal expansion in this heating step. That is, it is preferred that the bump-formed plate-like member is not expanded by heating in a resin-encapsulation step performed later. Thus, in the resin-encapsulation step, positions of the bumps 12 and the wiring pattern 22 are less prone to be deviated, and the positions are easily aligned.

Furthermore, as shown in FIG. 10, in the lower die cavity 111*b*, the resin 41 is placed on the bump 12-formed surface of the plate-like member 11 (resin placement step). In this step, for example, the opening at the lower end of the resin supply section (frame) 61 is opened by pulling the lower shutter 62 to cause the resin 41 to move downward from the opening, and thus, the resin 41 is supplied to (placed in) the lower die cavity 111*b*. Thereafter, the resin-encapsulation step is performed as in FIGS. 7 to 8. Although the resin 41 is a granule resin in FIG. 10, the resin 41 is not limited thereto. For example, the resin 41 may be a thermoplastic resin (e.g., a granule resin, a powder resin), and may be melted by the heat of the bump-formed plate-like member and then may be solidified by cooling. The resin 41 may be a liquid thermosetting resin before being cured and may be cured by the heat of the bump-formed plate-like member.

In the present example, the structure of the compression molding device is not limited to the structure shown in FIGS. 5 to 10, may be any structure, and may be the same as the structure of a general compression molding device, for example. Specifically, the structure of the compression molding device may be the same as or according to any of the structures shown in JP 2013-187340 A, JP 2005-225133 A, JP 2010-069656 A, JP 2007-125783 A, JP 2010-036542 A, and the like, for example. For example, the structure of the compression molding device may be the same structure as in FIGS. 2 to 6 of JP 2013-187340 A (structure in which a film retainer is attached to the upper die as substitute for having no intermediate die) as a substitute for the structure shown in FIGS. 5 to 10. A compressing molding method using such compression molding device (method for producing a resin-encapsulated electronic component) can be performed in the same manner as described in JP 2013-187340 A, for example. The resin supply means may have any alternative configuration to the resin supply means 60 shown in FIGS. 9 and 10. For example, the resin supply means may be a resin material distribution means (including a resin material introduction means, a measurement means, a hopper, a linear oscillatory feeder, and the like) described in JP 2010-036542 A. The resin supply means may have a configuration including a storage section, a measurement section, an introduction section, a supply section, a shutter, a tray, a slit, and the like as in a resin supply mechanism described in JP 2007-125783 A. For example, an upward-and-downward motion mechanism of a lower die and the like that are not shown in FIGS. 5 to 10 may be the same as or according to JP 2005-225133 A, JP 2010-069656 A, or the like, and for example, an elastic member may be connected to the lower part of the lower die cavity bottom member.

In the present example, a method in which compression molding is performed by evacuating the lower die cavity is used. The present invention, however, is not limited thereto, and another compression molding may be used.

The production method of the present invention is, as mentioned above, the production method including the resin-encapsulation step and may include any of other steps as shown in the present example.

In the present example, as mentioned above, the bump-formed plate-like member is placed on the release film, and in the state, the bump-formed plate-like member is transferred to the die cavity in the molding die. Thus, for example, the structures of the plate-like member and the transfer means can be simplified. In the present example, as mentioned above, the resin is placed on the bump-formed plate-like member in the state where the bump-formed plate-like member is placed on the release film. Thus, for example, in FIGS. 5 to 10, it can be prevented that the resin 41 and the lower die cavity bottom member 111*a* are in contact with each other, and the resin 41 is entered into a gap between the lower die 111 and the lower-die peripheral end retainer 112.

In the present invention, a means (mechanism) for transferring the bump-formed plate-like member (in the state where a resin is or is not placed thereon) is not limited to the configuration shown in FIGS. 5 to 10 and may be a transfer means (transfer mechanism) having any of the other configurations. For example, although the release film is a release film having a shape in which a long release film is rolled in FIGS. 5 to 10, the release film is not limited thereto. For example, the shape of the release film may be any shape such as a short release film, a long release film, or a rolled release film. For example, the long release film may be a short release film obtained by cutting (pre-cutting) the long release film or the rolled release film prior to being subjected to the production method of the present invention. In the case of using a pre-cut release film, the transfer step (step of transferring the bump-formed plate-like member to a die cavity in a molding die) is, for example, performed in the same manner as in FIG. 1 and the description thereof in JP 2013-187340 A.

Example 3

Yet another example of the present invention is described below. The present example shows yet another example of the production method using compression molding.

The production method of the present example is schematically shown in step cross-sectional views of FIGS. 11 to 14. As shown in FIGS. 11 to 14, the present example is different from Example 2 (FIGS. 5 to 10) in that a release film 100 is not used, and the shape of a plate-like member 11 is different.

In the present example, the outer edge of the plate-like member 11 has a protuberance, so that the central part of the plate-like member 11 becomes a resin containing portion. More specifically, as shown in FIGS. 11 to 14, the outer edge of the plate-like member 11 has a protuberance on the bump 12-formed surface of the plate-like member 11, so that a wall-like member 11b is formed. Thus, the resin containing portion 11c is formed in the central part of the plate-like member 11. That is, the outer edge of the plate-like member 11 has a protuberance to form a wall-like member 11b. Thus, the plate-like member 11 has a tray shape (box shape in which the upper surface is opened). The central part of the plate-like member 11 forms a resin containing portion (tray-shaped concave portion) 11c surrounded by the main body (bottom surface) and the wall-like member (outer edge) 11b of the plate-like member 11. The bumps 12 are formed using the main body (bottom surface) of the plate-like member 11 on the resin containing portion (concave portion) 11c side as shown in FIGS. 11 to 14. The wall-like member 11b is a part of the plate-like member 11 and is different from the bumps 12. For example, the wall-like member 11b may have a function of a heat radiation member or a shielding member that shields an electromagnetic wave. In the case where the plate-like member 11 has a wall-like member 11b, the shapes of the bumps 12 are not particularly limited and may be any shape. However, it is preferred that at least one bump 12 is the plate-like bump. In the present example, because of the resin containing portion 11c, it can be suppressed or prevented that the resin 41 and the bottom member of a lower die cavity are in contact with each other, and the resin 41 is entered into a gap between the lower-die peripheral end retainer and the bottom member of a lower die cavity without using a release film. Therefore, the costs can be reduced because a release film is not used, and a step of attaching and adsorbing a release film can be omitted. Accordingly, efficiency of producing a resin-encapsulated electronic component is improved.

In the present example, as a compression molding device including a molding dies (an upper die and a lower die), the same compression molding device as in Example 2 except for having no roll for a release film and an intermediate die can be used as shown in FIGS. 11 to 14. Specifically, as shown in FIGS. 11 to 14, the compression molding device includes, as main components, an upper die 1001 and a lower die 1011. The lower die 1011 includes a bottom member 1011a of a lower die cavity and a lower-die peripheral end retainer (main body of a lower die) 1012. The lower-die peripheral end retainer (main body of a lower die) 1012 is a frame-shaped side member of a lower die cavity. More specifically, the lower-die peripheral end retainer 1012 is arranged so as to surround the bottom member 1011a of a lower die cavity. There is a gap (adsorption hole) 1011c between the bottom member 1011a of a lower die cavity and the lower-die peripheral end retainer 1012. This gap 1011c is, as shown in an arrow 1014 of FIGS. 12 and 13, evacuated with a vacuum pump (not shown), so that the plate-like member can be adsorbed. After the compression molding, as shown in an arrow 1016 of FIG. 14, the plate-like member can be detached by delivering air from this gap 1011c. The height of the upper surface of the lower-die peripheral end retainer 1012 is higher than the height of the upper surface of the bottom member 1011a of a lower die cavity. Accordingly, a lower die cavity (concave portion) 1011b surrounded by the upper surface of the bottom member 1011a of the lower die cavity and the inner peripheral surface of the lower-die peripheral end retainer 1012 is formed. The upper die 1001 has a hole (through hole) 1003. Thus, as shown in an arrow 1007 of FIG. 13, at least lower die cavity 1011b can be evacuated by sucking from the hole 1003 with a vacuum pump (not shown) after the clamping. An O ring 1012a having elasticity is attached to the outer edge of the upper surface of the lower die retainer 1012. Thus compression molding device (device for producing a resin-encapsulated electronic component) further includes a resin placement means and a transfer means although they are not shown. The resin placement means places a resin on the bump-formed surface of the bump-formed plate-like member. The transfer means transfers the bump-formed plate-like member to a die cavity of a molding die.

In the production method of the present example, as shown in FIGS. 11 to 14, the plate-like member 11 in which the resin 41 is placed on the resin containing portion 11c is transferred to the position of the lower die cavity 1011b without using a release film. A gap 1011c between the lower-die peripheral end retainer 1012 and the bottom member 1011a of a lower die cavity is evacuated with a vacuum pump (not shown) as shown in an arrow 1014 of FIG. 12 as substitute for causing a release film to be adsorbed to the lower die and the lower-die peripheral end retainer 1012. Thus, the plate-like member 11 is adsorbed to the lower die cavity 1011b (the upper surface of the bottom member 1011a of a lower die cavity and the inner peripheral surface of the lower-die peripheral end retainer 1012). Except for this, the production method of the present example (FIGS. 11 to 14) can be performed in the same manner as in FIGS. 5 to 8 of Example 2.

Figure 12:
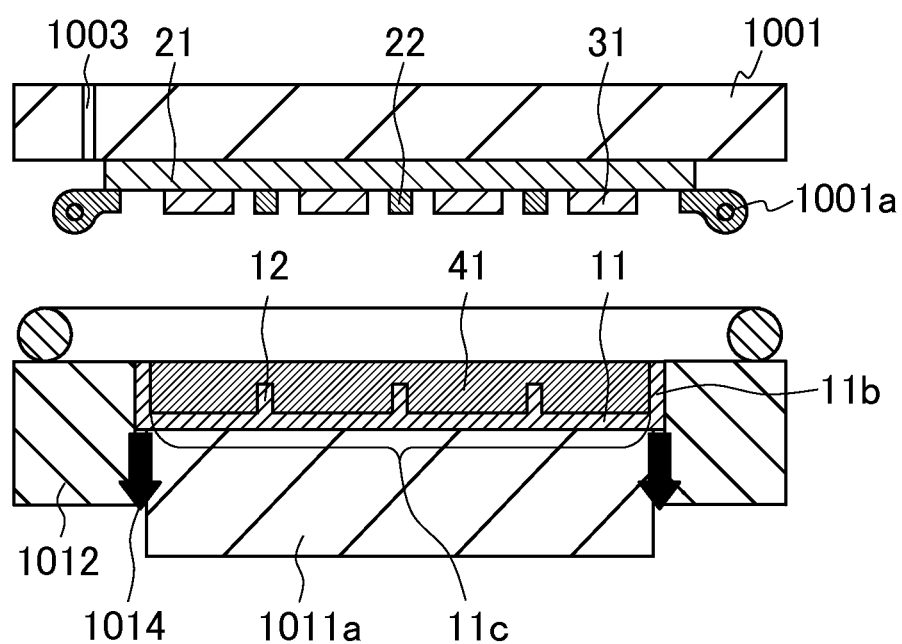
FIG. 12 is a cross-sectional view showing an example of another step in the same production method as in FIG. 11.
Figure 13:
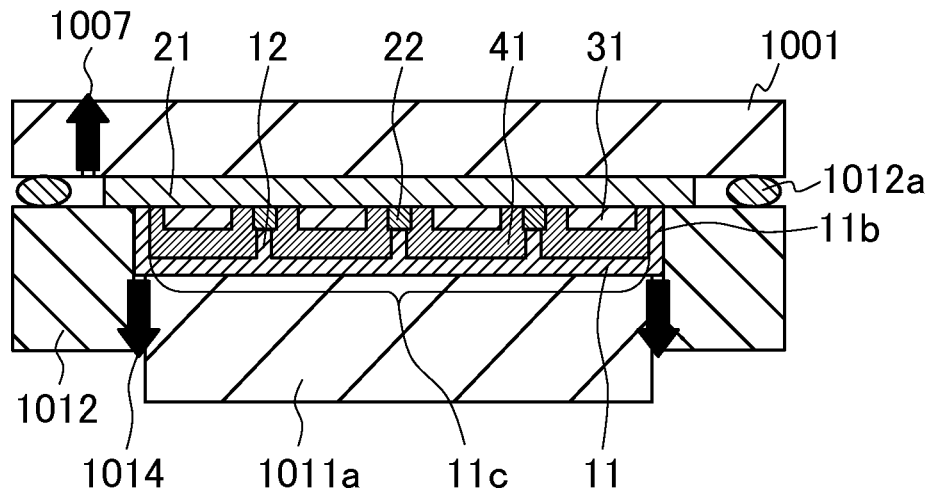
FIG. 13 is a cross-sectional view showing an example of yet another step in the same production method as in FIG. 11.
Figure 14:
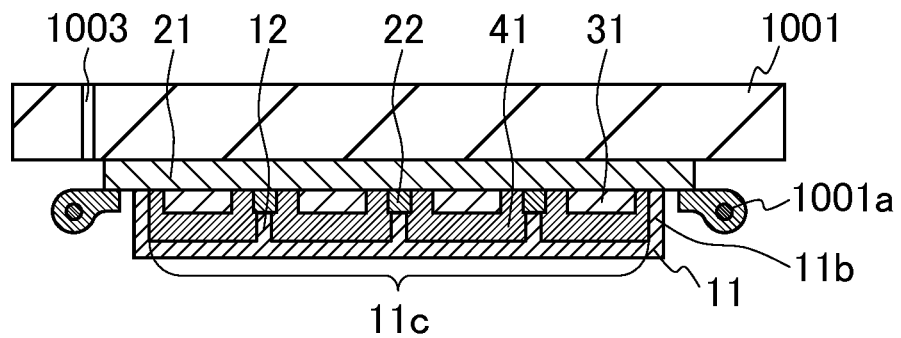
FIG. 14 is a cross-sectional view showing an example of yet another step in the same production method as in FIG. 11.
Figure 14:
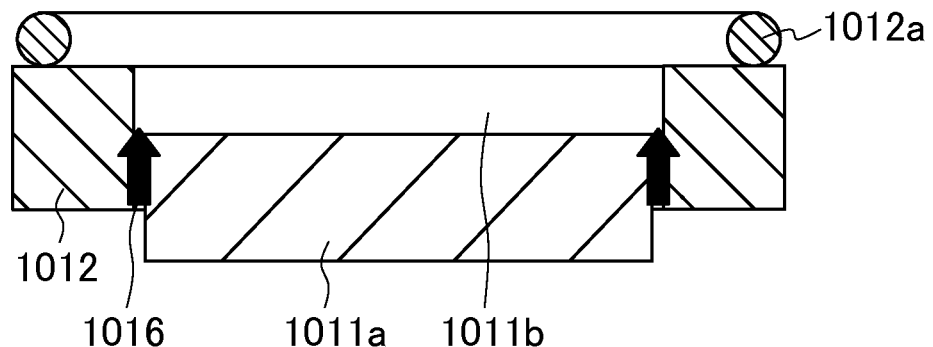

The step (resin-encapsulation step) shown in FIGS. 13 and 14 can be, for example, more specifically, performed as follows. That is, first, the lower die 1011 in the state of FIG. 12 is moved upward to cause a die surface of an upper die 1001 to come into contact with an upper end of an O ring 1012a of a lower die. At that time, a required gap between the surface of the upper die (the die surface of the upper die 1001) and the surface of the lower die (the die surface of the lower die 1011) is held. That is, prior to completely clamping the upper die 1001 and the lower die 1011, intermediate clamping of holding a required gap between the upper die 1001 and the lower die 1011 is performed. At the time of this intermediate clamping, an outside air-excluding space can be formed by setting a gap between the surface of the upper die and the surface of the lower die and a cavity space to be in an outside air-excluding state. Moreover, at that time, as shown in an arrow 1007 of FIG. 13, the outside air-excluding space can be set to have a predetermined degree of vacuum by forcedly sucking and discharging air in the outside air-excluding space from the hole 1003 of the upper die. Subsequently, the surface of the upper die (the die surface of the upper die 1001) and the surface of the lower die (the die surface of the lower die 1011) are closed together to perform complete clamping. Moreover, the bottom member 1011a of a cavity is moved upward. At that time, the resin 41 is in the state of having fluidity. Accordingly, as shown in FIG. 13, the bumps 12 and the wiring pattern 22 are joined to each other, electronic components 31 are immersed in the resin 41, and the resin 41 in the lower die cavity 1011b is pressurized. Thus, electronic components 31 held on the substrate 11 can be subjected to compression molding (encapsulation molding) in the resin 41 (cured resin) having a required shape. More specifically, electronic components 31 held on the substrate 21 in the lower die cavity 1011b (including bumps and a wiring pattern 22) can be subjected to compression molding (resin molding) in the molded package (resin molding) 41 corresponding to the shape of the lower die cavity 1011b. At that time, the plate-like member 11 is in the state of being held on the upper surface side of the molded package 41, opposite to the substrate 21. Then, after an elapse of required time necessary to cure the resin 41, as shown in FIG. 14, unclamping the upper die and the lower die is performed. Specifically, the lower die 1011 (the bottom member 1011a of a lower die cavity, and the lower-die peripheral end retainer 1012) are caused to move downward together with the O ring 1012a. Thus, the lower die cavity 1011b is opened to release the depressurization. At that time, the depressurization (evacuation) of the gap between the bottom member 1011a of a lower die cavity and the lower-die peripheral end retainer 1012 is released. As shown in an arrow 1016, air may be delivered to the gap. Accordingly, a resin-encapsulated electronic component (molded article) having a plate-like member 11 that has a resin containing portion 11c, a substrate 21, electronic components 31, a wiring pattern, and bumps 12 can be obtained.

The present example is not limited thereto, and for example, the resin placement step may be performed after the transfer step as in FIGS. 9 to 10 of Example 2. In this case, it is preferred that the bump-formed plate-like member is heated in the lower die cavity prior to the resin placement step as in Example 2 (heating step). Moreover, it is preferred that the bump-formed plate-like member is sufficiently subjected to thermal expansion in this heating step for the same reason as in Example 2.

Figure 15:
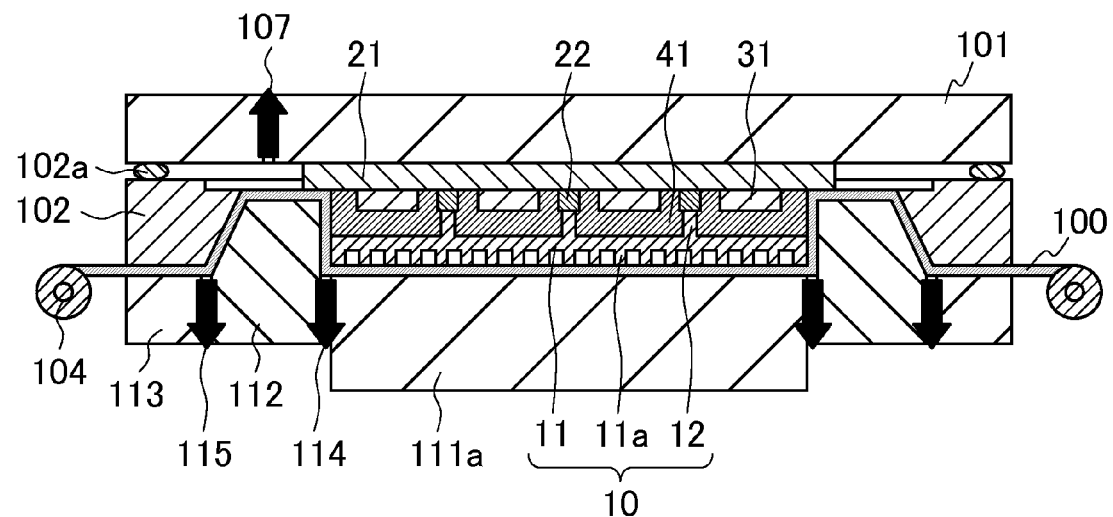
FIG. 15 is a cross-sectional view showing an example of a step in yet another example of the production method of the present invention using compression molding.
Figure 16:
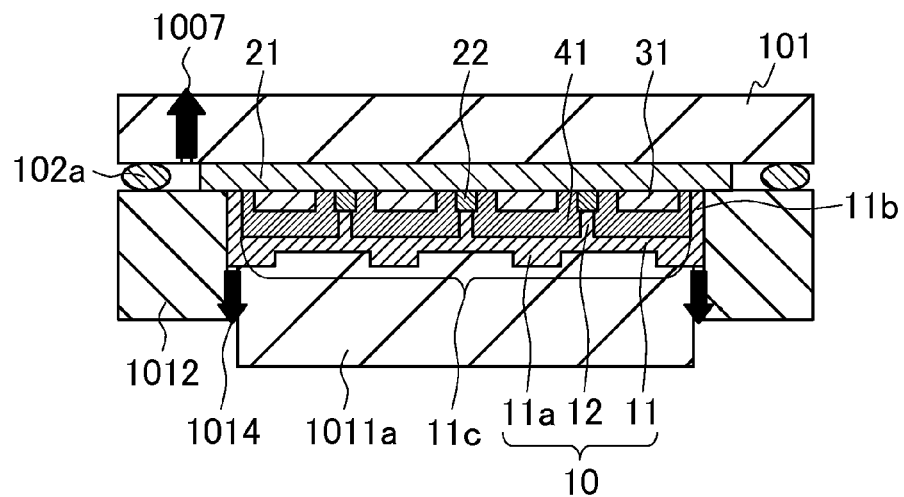
FIG. 16 is a cross-sectional view showing an example of a step in yet another example of the production method of the present invention using compression molding.

In the present invention, the shape of the plate-like member is not limited to the shapes of the present example and Examples 1 to 2 and may be any shape. For example, the shape of the plate-like member may have the same shape as in the plate-like member shown, as an example, in the Patent Document 2 (JP 2013-187340 A) except that bumps are formed on the plate like member. FIGS. 15 and 16 show examples of the production method (Modification) in which the shape of a plate-like member is modified. FIG. 15 is the same as in FIGS. 5 to 8 (Example 2) except that the plate-like member 11 includes a heat radiation fin 11a on the surface opposite to the surface in which the bumps 12 are formed (the surface facing the lower die cavity bottom member 111a in FIG. 15), and the production method can be performed in the same manner as in Example 2 using the same compression molding device as in FIGS. 5 to 8. FIG. 16 is the same as in FIGS. 11 to 14 (Example 3) except that the plate-like member 11 has a heat radiation fin 11a on the surface opposite to the bump 12-formed surface (the surface facing the lower die cavity bottom member 111a in FIG. 16), and the production method can be performed in the same manner as in Example 3 using the same compression molding device as in FIGS. 11 to 14. In the compression molding device of FIG. 16, as shown in FIG. 16, the upper surface of the bottom member 1011a of a lower die cavity has an uneven shape capable of fitting in the uneven shape of the heat radiation fin 11a. Accordingly, there is an advantage in that the plate-like member 11 is stable in the lower die cavity, and the upper surface of the bottom member 1011a of a lower die cavity is less prone to be damaged by the heat radiation fin. Moreover, it is preferred that the heat radiation fin 11a has a shape in which a space is not formed between the lower-die peripheral end retainer 1012 and the plate-like member 11 as shown in FIG. 16. Accordingly, the suction of the lower die cavity by depressurization (arrow 1014) is effectively performed.

Example 4

Yet another example of the present invention is described below. The present example shows yet another example of the production method using compression molding.

Figure 17:
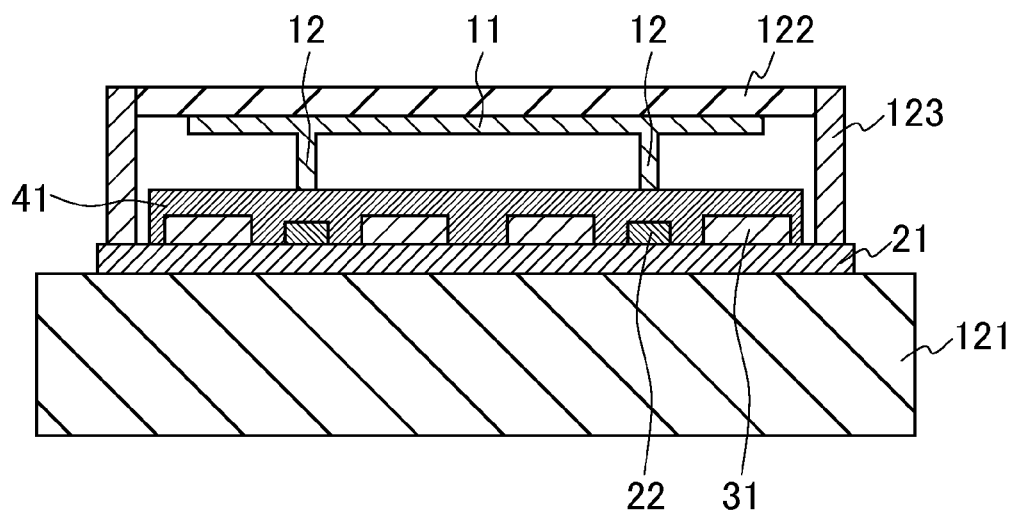
FIG. 17 is a cross-sectional view showing yet another example of the production method of the present invention using compression molding.

The production method of the present example is schematically shown in a cross-sectional view of FIG. 17. As shown in FIG. 17, this production method is performed using a lower die 121, an upper die (mounter) 122, and a vacuum chamber 123. The upper surface of the lower die 121 is a flat surface, and the substrate of the resin-encapsulated electronic component can be placed on the upper surface. The vacuum chamber 123 has a columnar shape corresponding to the shape of the resin-encapsulated electronic component and can be placed on the substrate of the resin-encapsulated electronic component. The upper die 122 can be fit in the inner wall of the vacuum chamber 123.

In the production method of the present example, first, in the substrate 21 on one surface of which electronic components 31 and a wiring pattern 22 are fixed, a liquid resin (thermosetting resin) 41 is printed on the surface on which electronic components 31 and a wiring pattern 22 are fixed. Subsequently, the bumps 12 of the bump-formed plate-like member in which the bumps 12 are formed on the plate-like member 11 is caused to be in contact with the wiring pattern 22 by causing the bumps 12 to penetrate the liquid resin 41. Thus, the substrate 21, the electronic components 31, the resin 41, the plate-like member 11, and the bumps 12 are arranged so as to have the same positional relationship as in a completed resin-encapsulated electronic component 20 (FIG. 3). Then, for example, as shown in FIG. 17, the substrate 21, the electronic components 31, the resin 41, the plate-like member 11, and the bumps 12 are placed on the upper surface of the lower die 121 so as to have the positional relationship (arrangement). At that time, as shown in FIG. 3, the surface of the substrate 21, opposite to the electronic component 32-arranged surface is caused to be in contact with the upper surface of the lower die 121, and the bump-formed plate-like member (plate-like member 11 and bump 12) is placed on the electronic component 31-arranged surface.

Subsequently, the vacuum chamber 123 is placed on a portion of the outer edge of the upper surface of the substrate 21, on which the resin 41 is not arranged (placed). Accordingly, the electronic components 31, the resin 41, the plate-like member 11, and the bumps 12 are surrounded by the vacuum chamber 123. Then, the upper die 122 is caused to move downward from the upper side of the electronic components 31, the resin 41, the plate-like member 11, and the bumps 12 to cause the upper die 122 to fit in the inner wall of the vacuum chamber 123. Thus, the electronic components 31, the resin 41, and the bumps 12 are contained in an inner space sealed by being surrounded by the plate-like member 11, the vacuum chamber 123, and the upper die 122. Moreover, the inner space is evacuated with a vacuum pump (not shown). Accordingly, the electronic components 31, the resin 41, the plate-like member 11, and the bumps 12 are pressed by the upper die 122. Then, in this state, the liquid resin (thermosetting resin) 41 is heated and cured, and the electronic components 31 are subjected to resin-encapsulation together with the plate-like member 11 and the bumps 12. The heating of the liquid resin 41 can be performed by heating the lower die 121, for example. As described above, a resin-encapsulated electronic component that is the same as the resin-encapsulated electronic component 20 shown in FIG. 3 can be produced.

In the present example, for example, depressurization with a vacuum chamber may be omitted. However, for example, it is preferred that pressurization with a vacuum chamber is performed when air and a space between the plate-like member and the resin are not allowed to be present or the like. In the case where depressurization with a vacuum chamber is omitted, pressing with the upper die (mounter) may or may not be performed.

Figure 18:
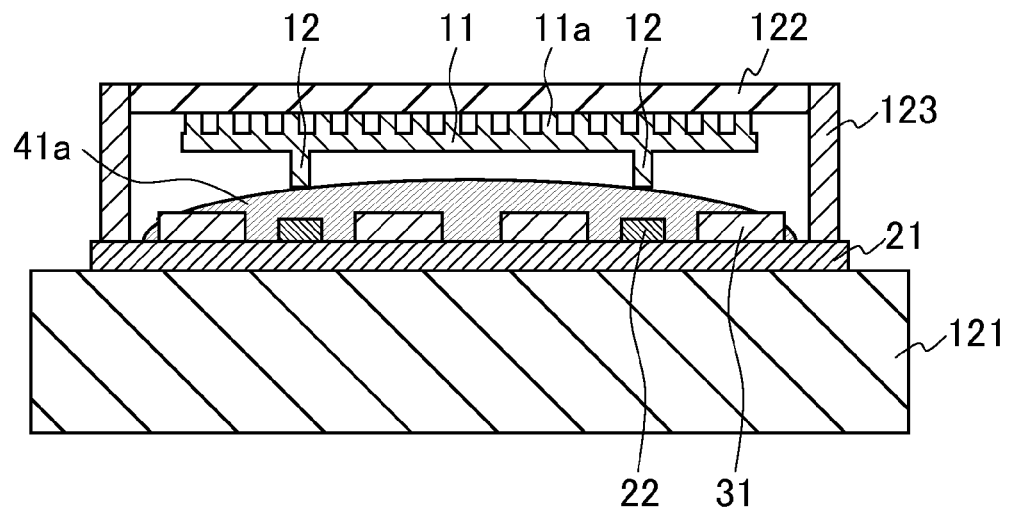
FIG. 18 is a cross-sectional view showing yet another example of the production method of the present invention using compression molding.

A modification of the production method of the present example is schematically shown in a cross-sectional view of FIG. 18. The production method in FIG. 18 is the same as the production method in FIG. 17 except that the liquid resin (thermosetting resin) 41a is applied to the surface of the substrate 21, on which the electronic components 31 and the wiring pattern 22 are fixed as substitute for printing, and the plate-like member 11 has a heat radiation fin 11a on the surface opposite to the bump 12-formed surface (the surface facing the upper die 122 in FIG. 18). In the production method of FIG. 17, a bump-formed plate-like member having a heat radiation fin may be used as in FIG. 18. In the production method of FIG. 18, a bump-formed plate-like member having no heat radiation fin may be used as in FIG. 17. For example, in FIGS. 17 and 18, a resin 41 or 41a may be arranged on the surface of the substrate 21 on which the electronic components 31 and the wiring pattern 22 are fixed by a laminate of a sheet resin, spin coating of a resin, or the like as substitute for printing or applying of a resin.

Example 5

Yet another example of the present invention is described below. The present example shows yet another example of the production method using compression molding.

In the present example, a method for producing a resin-encapsulated electronic component using a pre-cut release film and a rectangle-like frame that has a through hole (resin supply section) and a compression molding device (device for performing resin-encapsulation of electronic components) are described. In the present example, a resin material (granule resin) is transferred and set to the lower die cavity in the state where the resin material (granule resin) is placed on the bump-formed plate-like member.

In the present example, a frame is arranged on a pre-cut release film, and a bump-formed plate-like member on which the granule resin is placed is arranged on the release film in a frame through hole (resin supply section). Thus, the granule resin can be prevented from being fallen from the bump-formed plate-like member. Although the case where the resin material is a granule resin is described in the present example, the present example can be performed in the same manner as in the case where the resin material is a resin other than a glanule resin (e.g., a powdery resin, a liquid resin, a plate-like resin, a sheet-like resin, a film-like resin, a paste-like resin).

The present example is described in more detail below using FIGS. 19 to 22.

Figure 19:
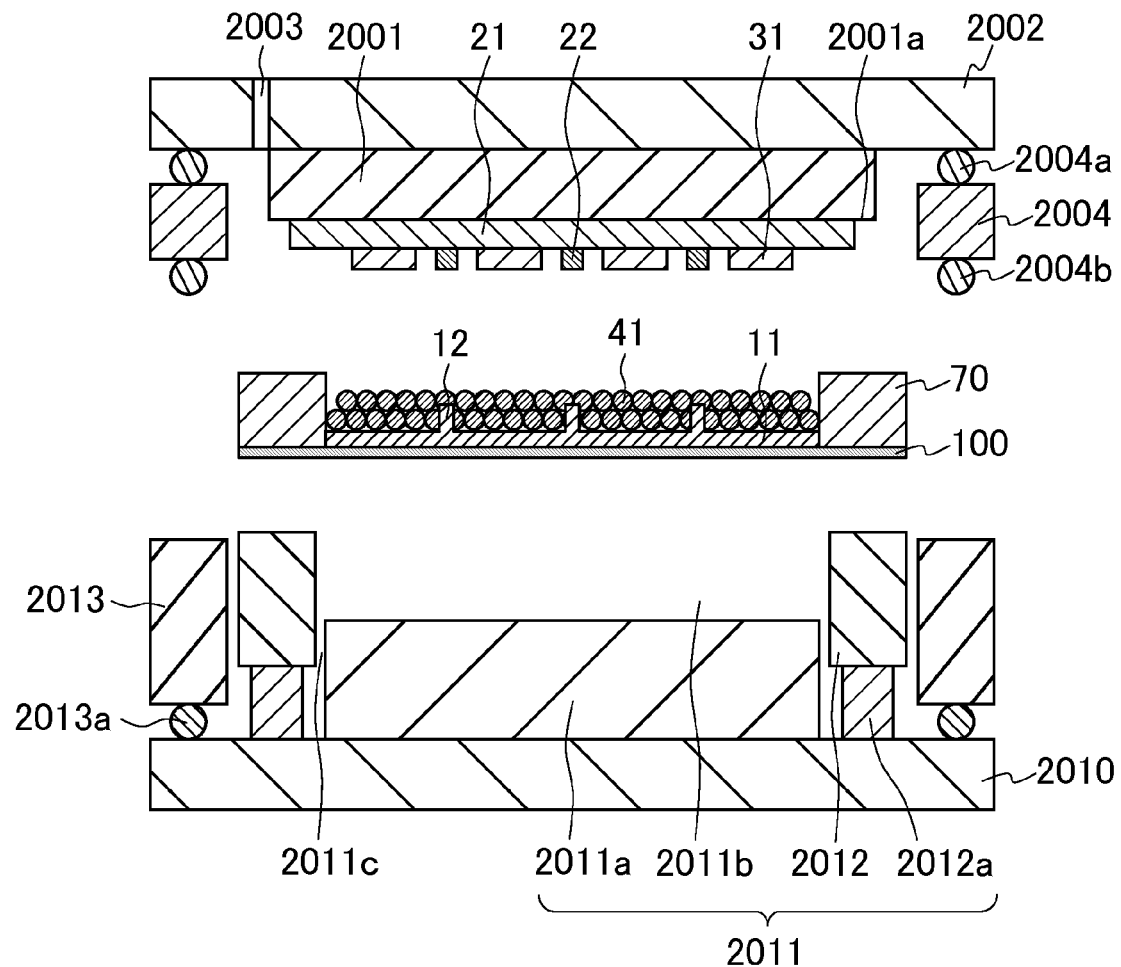
FIG. 19 is a cross-sectional view showing an example of a step in yet another example of the production method of the present invention using compression molding.

The compression molding device (device for producing a resin-encapsulated electronic component) in the present example is described using FIG. 19. FIG. 19 is a schematic view showing a structure of a part of a molding die that is a part of the compression molding device. FIG. 19 shows the unclamping state before supplying the resin material to this molding die.

The compression molding device of FIG. 19 is the same as that in Example 3 (FIGS. 11 to 14) in that the molding die includes an upper die and a lower die and is different from that in Example 3 (FIGS. 11 to 14) in that the molding die includes outside air-excluding members of an upper die and outside air-excluding members of a lower die. More specifically, the compression molding device is as follows. That is, the compression molding device of FIG. 19 includes, as main components, an upper die 2001 and a lower die 2011 arranged so as to face the upper die. The upper die 2001 is attached to the upper die base plate 2002 in the state of being vertically suspended from the upper die base plate 2002. Outside air-excluding members 2004 of the upper die are provided in the outer peripheral position of the upper die 2001 that is on the upper die base plate 2002. An O ring 2004a for excluding outside air is provided on the upper end surface of each outside air-excluding member 2004 of the upper die (portion sandwiched between the upper die base plate 2002 and the outside air-excluding member 2004 of the upper die). An O ring 2004b for excluding outside air is provided on the lower end surface of each outside air-excluding member 2004 of the upper die. The upper die base plate 2002 is provided with a hole 2003 for forcedly sucking and discharging air in a space of the mold. A substrate set part 2001a to which the electronic component 31-attached substrate 21 is supplied and set (attached) in the state where the electronic component 31-attached surface side faces downward is provided on the die surface (lower surface) of the upper die 2001. The substrate 21 can be attached to the substrate set part 2001a by a clamper (not shown) or the like, for example. A wiring pattern 22 is provided on the electronic component 31-attached surface of the substrate 21 as in each of the examples.

The lower die 2011 is formed of the lower die cavity bottom member 2011a, an lower-die peripheral end retainer 2012, and an elastic member 2012a. The lower die 2011 further includes a cavity (lower die cavity) 2011b that is a space for molding a resin on the die surface. The lower die cavity bottom member 2011a is provided below the lower die cavity 2011b. The lower-die peripheral end retainer (a frame of a lower die, a side member of a cavity) 2012 is arranged so as to surround the lower die cavity bottom member 2011a. The height of the upper surface of the lower-die peripheral end retainer 2012 is higher than the height of the upper surface of the lower die cavity bottom member 2011a. Accordingly, a lower die cavity (concave portion) 2011b surrounded by the upper surface of the lower die cavity bottom member 2011a and the inner peripheral surface of the lower-die peripheral end retainer 2012 is formed. There is a gap (adsorption hole) 2011c between the the lower die cavity bottom member 2011a and the lower-die peripheral end retainer 2012. The release film or the like can be adsorbed by evacuating this gap 2011c with a vacuum pump (not shown) as mentioned above. The lower die 2011 and the lower-die peripheral end retainer 2012 are attached in the state where they are placed on a lower die base plate 2010. A buffer elastic member 2012a is provided between the lower-die peripheral end retainer 2012 and the lower die base plate 2010. Furthermore, the outside air-excluding member 2013 for the lower die is provided in the outer peripheral position of the lower-die peripheral end retainer 2012 on the lower die base plate 2010. An O ring 2013a for excluding outside air is provided on the lower end surface of the outside air-excluding member 2013 of a lower die (portion sandwiched between the lower die base plate 2010 and the outside air-excluding member 2013 of the lower die). The outside air-excluding member 2013 for the lower die is arranged immediately below the outside air-excluding member 2004 of the upper die and the O ring 2004b for excluding outside air. With the above-described configuration, at least lower die cavity can be in the outside air-excluding state by joining the outside air-excluding member 2004 of the upper die, including the O rings 2004a and 2004b and the air-excluding member 2013 for the lower die, including the O ring 2013a at the time of clamping both of the upper die and the lower die.

The method for producing a resin-encapsulated electronic component of the present example using this compression molding device is described below. That is, first, as shown in FIG. 19, the substrate 31 is attached to the die surface (substrate set part 2001a) of the upper die 2001 as mentioned above. Furthermore, as shown in FIG. 19, the granule resin 41 is supplied to the lower die cavity 2011b using a rectangle frame 70 that has a through hole. More specifically, as shown in FIG. 19, the frame 70 is placed on the release film 100 cut to have a required length in advance (pre-cut). At that time, the pre-cut release film 100 is adsorbed and fixed on the lower surface of the frame 70. Subsequently, a bump-formed plate-like member obtained by forming bumps 12 on a plate-like member 11 is placed on a release film 100 from the opening (resin supply section) on an upper side of the through hole of the frame 70. At that time, the bumps 12 are in the state of facing upward (side opposite to the release film 100). In the present example, the bump-formed plate-like member does not include a wall-like member 11b and a resin containing portion (concave portion) 11c as in Example 2 (FIGS. 5 to 10). The resin granules 41 are supplied (placed) on the bump 12-formed surface of the plate-like member 11 in the state where the granule resin 41 is flattened. As described above, as shown in FIG. 19, a "resin supply frame" in which the resin 41 is supplied to the space surrounded by the plate-like member 11 and the frame 70, and the plate-like member 11 and the frame 70 are placed on the release film 100 can be formed. Moreover, the resin supply frame is transferred and, as shown in FIG. 19, caused to enter between the upper die 2001 and the lower die 2011 in the unclamping state (position of the lower die cavity 2011b).

Figure 20:
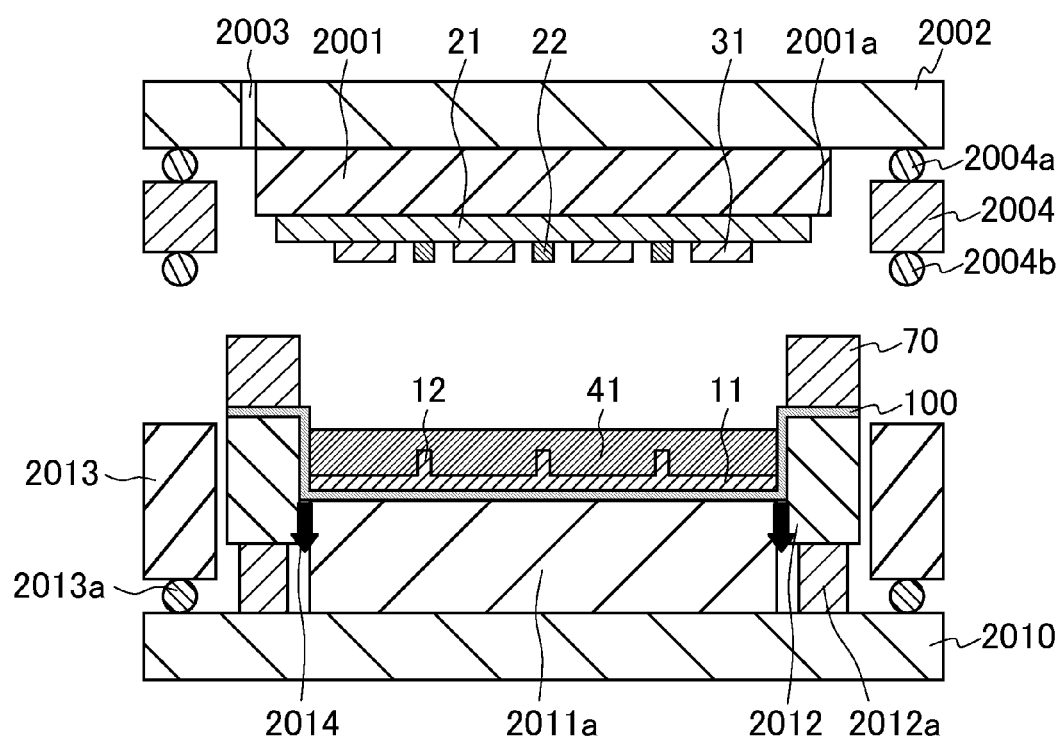
FIG. 20 is a cross-sectional view showing an example of a step in yet another example of the production method of the present invention using compression molding.

Subsequently, the resin supply frame is placed on the die surface of the lower die 2011. At that time, as shown in FIG. 20, the release film 100 is sandwiched between the frame 70 and the lower-die peripheral end retainer 2012, and an opening on the lower side of the through hole of the frame 70 is caused to correspond to an opening (in the surface of the lower die) of the lower die cavity 2011b. Moreover, as shown in an arrow 2014 of FIG. 20, the adsorption hole 2011c of the lower die is adsorbed with a vacuum pump to evacuate. Accordingly, as shown in FIG. 20, the release film 100 is adsorbed to cover the cavity surface of the lower die cavity 2011b, and the granule resin 41 is supplied and set to the lower die cavity 2011b. Moreover, the lower die 2011 is heated to melt resin 41 as shown in FIG. 20. Thereafter, the frame 70 is removed while adsorbing the release film 100 to the cavity surface of the lower die cavity 2011b by depressurization indicated by the arrow 2014.

Figure 21:
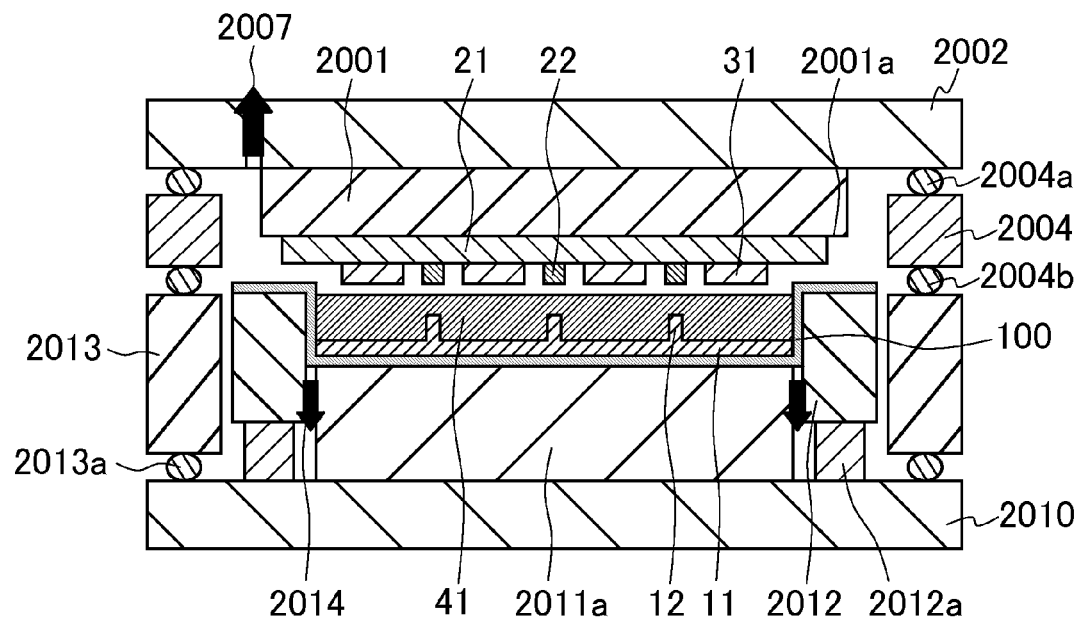
FIG. 21 is a cross-sectional view showing yet another example of the production method of the present invention using compression molding.

Subsequently, the upper die and the lower die are clamped. First, as shown in FIG. 21, intermediate clamping of causing the surface of the substrate (electronic component 31-fixed surface of the substrate 21) and the surface of the lower die to be in the state of having a required gap is performed. That is, in the state where frame 70 is removed from FIG. 20, the lower die 2011 is moved upward. Accordingly, as shown in FIG. 21, the outside air-excluding member 2004 for the upper die and the outside air-excluding member 2013 for the lower die are closed together in the state of sandwiching an O ring 2004b between them. As described above, as shown in FIG. 21, an outside air-excluding space surrounded by the upper die 2001, the lower die 2011, the outside air-excluding member 2004 for the upper die, and the outside air-excluding member 2013 for the lower die is formed. In this state, as shown in an arrow 2007 of FIG. 21, at least the outside air-excluding space is evacuated by suction with a vacuum pump (not shown) through the hole 2003 of the upper die base plate 2002 to set to a predetermined degree of vacuum.

Figure 22:
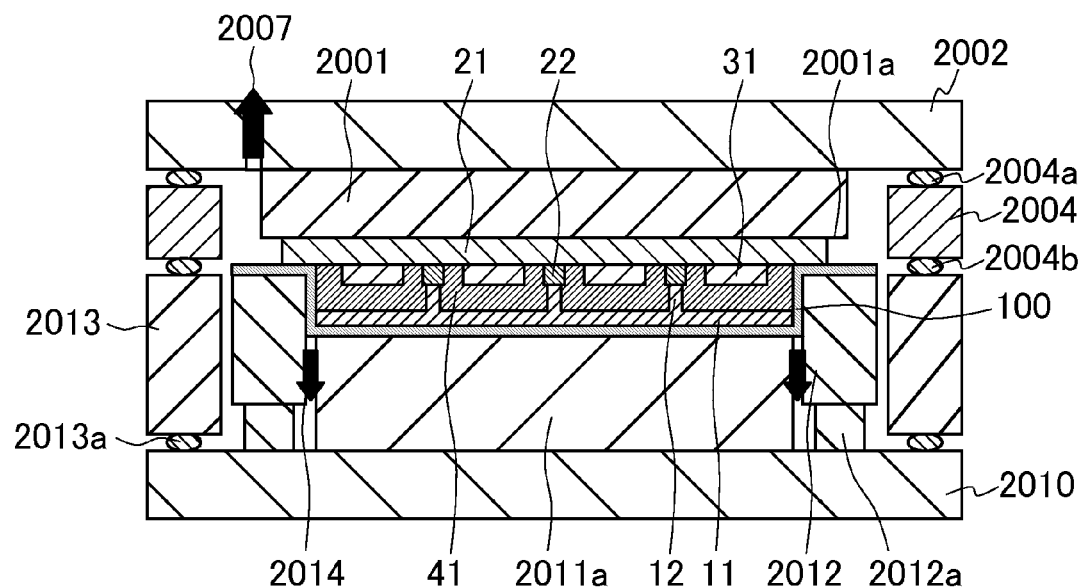
FIG. 22 is a cross-sectional view showing yet another example of the production method of the present invention using compression molding.

Moreover, as shown in FIG. 22, the surface of the substrate and the surface of the lower die are joined to each other to completely clamp. That is, the lower die 2011 is moved upward from the state of FIG. 21. Accordingly, as shown in FIG. 22, the upper surface of the lower-die peripheral end retainer 2012 comes into contact with the surface of the substrate 21 supplied and set to the upper die 2001 (the electronic component 31-fixed surface) via the release film 100 (so as to sandwich the release film 100). Then, the bottom member 2011a for the lower die cavity is moved further upward together with other members of the lower die base plate 2010 and the lower die 2011. At that time, the resin 41 is in the state of having fluidity. Accordingly, as shown in FIG. 22, the tips of the bumps 12 come into contact with (are caused to be in contact with) the wiring pattern 22 of the substrate 21, and the electronic components 31 are immersed in the resin 41 in the lower die cavity 2011b, and the resin 41 is pressurized. At that time, as shown in FIG. 22, the elastic member 2012a and the O rings 2004a, 2004b, and 2013a are shrunk to function as a cushion. Accordingly, as mentioned above, the resin 41 is pressurized to perform compression molding. Then, the resin 41 is cured. Thus, the electronic components 31 are encapsulated in the resin 41 between the bump 12-formed surface of the plate-like member 11 and the wiring pattern 22-formed surface of the substrate 21, and the bumps 12 can be caused to be in contact with the wiring pattern 22 (resin-encapsulation step). After the elapse of time required to cure the resin 41, the upper die and the lower die are unclamped in the same manner as in Example 2 or 3 (FIG. 8 or 14). Thus, a molded article (resin-encapsulated electronic component) composed of the substrate 21, the electronic components 31, the wiring pattern 22, the resin 41, the bumps 12, and the plate-like member 11 can be obtained in the lower die cavity 2011b.

In the present example, the structure of the compression molding device (device for producing a resin-encapsulated electronic component) is not limited to the structure in FIGS. 19 to 22 and may be the same as or according to the structure of a general compression molding device, for example. Specifically, for example, the structure of the compression molding device may be the same as or according to the structure shown in any of JP 2013-187340 A, JP 2005-225133 A, JP 2010-069656 A, JP 2007-125783 A, JP 2010-036542 A, and the like.

The present invention is not limited by the above-mentioned examples and any appropriate combinations, changes, or selective adoption thereof can be made as necessary without departing from the spirit and scope of the present invention.

For example, the shapes of the bumps in the bump-formed plate-like member are not limited to the shapes shown in FIG. 2 and may be any shapes. As an example, as mentioned above, at least a part of the bumps may have a plate-like shape. A required area corresponding to one resin-encapsulated electronic component (one product unit) on the surface of the substrate may be partitioned with the plate-like electrode.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

The invention claimed is:

1. A method for producing a resin-encapsulated electronic component including a substrate; at least one electronic component; a resin; a plate-like member having at least one surface; at least one bump; and a wiring pattern, the method comprising:
    a step of disposing the at least one electronic component on the surface; and
    a resin-encapsulation step of encapsulating the at least one electronic component in the resin, wherein
    the resin-encapsulation step comprises:
        encapsulating the at least one electronic component in the resin between a bump-formed surface of the plate-like member on which the at least one bump is formed and a wiring pattern-formed surface of the substrate on which the wiring pattern is formed, and
        causing the at least one bump to be in contact with the wiring pattern,
    in the resin-encapsulation step, the resin-encapsulation of the at least one electronic component is performed by compression molding,
    the method further comprises:
        a resin placement step of placing the resin on the bump-formed surface of the plate-like member; and
        a transfer step of transferring the plate-like member to a die cavity in a molding die, wherein
        the resin-encapsulation step is performed by compression molding of the resin in the die cavity together with the plate-like member and the at least one electronic component in a state where the at least one electronic component is immersed in the resin placed on the plate-like member,
    the transfer step comprises transferring the plate-like member to the die cavity in the molding die in a state where the plate-like member is placed on a release film so as to face the bump-formed surface upward, and
    the transfer step comprises placing a frame on the release film together with the plate-like member, and transferring the bump-formed plate-like member to the die cavity in the molding die in a state where the plate-like member is surrounded by the frame.

2. The method according to claim 1, wherein
the resin placement step comprises placing the frame on the release film together with the plate-like member, and placing the resin on the bump-formed surface by supplying the resin to a space surrounded by the plate-like member and the frame in a state where the plate-like member is surrounded by the frame.

3. The method according to claim 2, wherein
the resin placement step is performed prior to the transfer step.

* * * * *